(12) United States Patent
Raring et al.

(10) Patent No.: US 9,093,820 B1
(45) Date of Patent: Jul. 28, 2015

(54) METHOD AND STRUCTURE FOR LASER DEVICES USING OPTICAL BLOCKING REGIONS

(75) Inventors: James W. Raring, Fremont, CA (US);
You-Da Lin, Fremont, CA (US);
Christiane Poblenz, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 13/357,518

(22) Filed: Jan. 24, 2012

Related U.S. Application Data

(60) Provisional application No. 61/436,042, filed on Jan. 25, 2011.

(51) Int. Cl.
| | |
|---|---|
| *H01S 5/00* | (2006.01) |
| *H01S 5/02* | (2006.01) |
| *H01S 5/20* | (2006.01) |
| *H01S 5/32* | (2006.01) |
| *H01S 5/34* | (2006.01) |

(52) U.S. Cl.
CPC ............ *H01S 5/3219* (2013.01); *H01S 5/0206* (2013.01); *H01S 5/2004* (2013.01); *H01S 5/2018* (2013.01); *H01S 5/3403* (2013.01)

(58) Field of Classification Search
CPC ... H01S 5/0206; H01S 5/2004; H01S 5/2018; H01S 5/3219; H01S 5/3403
USPC .............................. 372/44.011, 45.01, 45.011
See application file for complete search history.

(56) References Cited

U.S. PATENT DOCUMENTS

| | | | |
|---|---|---|---|
| 4,318,058 A | 3/1982 | Mito et al. |
| 4,341,592 A | 7/1982 | Shortes et al. |
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Gastiglia et al. Al0.83In0.17N lattice-matched to GaN used as an optical blocking layer in GaN-based edge emitting laser, Applied Physics Letters, 94, 193506, 2009.*

(Continued)

*Primary Examiner* — Yuanda Zhang
(74) *Attorney, Agent, or Firm* — Kilpatrick Townsend & Stockton LLP

(57) ABSTRACT

An optical device includes a gallium and nitrogen containing substrate having a surface region and an optical blocking region of InAlN material overlying the surface region. A strain control region maintain quantum wells within a predetermined strain state. The strained region is preferably a confined heterostructure.

24 Claims, 21 Drawing Sheets

(56) References Cited

U.S. PATENT DOCUMENTS

| | | | |
|---|---|---|---|
| 5,888,907 A | 3/1999 | Tomoyasu et al. | |
| 5,926,493 A | 7/1999 | O'Brien et al. | |
| 5,951,923 A | 9/1999 | Horie et al. | |
| 6,044,099 A * | 3/2000 | Shono et al. | 372/46.014 |
| 6,069,394 A | 5/2000 | Hashimoto et al. | |
| 6,072,197 A | 6/2000 | Horino et al. | |
| 6,147,953 A | 11/2000 | Duncan | |
| 6,153,010 A | 11/2000 | Kiyoku et al. | |
| 6,195,381 B1 | 2/2001 | Botez et al. | |
| 6,239,454 B1 | 5/2001 | Glew et al. | |
| 6,379,985 B1 | 4/2002 | Cervantes et al. | |
| 6,451,157 B1 | 9/2002 | Hubacek | |
| 6,489,636 B1 | 12/2002 | Goetz et al. | |
| 6,542,528 B1 * | 4/2003 | Sato et al. | 372/45.01 |
| 6,586,762 B2 | 7/2003 | Kozaki | |
| 6,635,904 B2 | 10/2003 | Goetz et al. | |
| 6,639,925 B2 | 10/2003 | Niwa et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,858,882 B2 | 2/2005 | Tsuda et al. | |
| 6,920,166 B2 | 7/2005 | Akasaka et al. | |
| 7,009,199 B2 | 3/2006 | Hall | |
| 7,019,325 B2 | 3/2006 | Li et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn | |
| 7,128,849 B2 | 10/2006 | Setlur et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike et al. | |
| 7,555,025 B2 | 6/2009 | Yoshida | |
| 7,598,104 B2 | 10/2009 | Teng et al. | |
| 7,691,658 B2 | 4/2010 | Kaeding et al. | |
| 7,709,284 B2 | 5/2010 | Iza et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,017,932 B2 | 9/2011 | Okamoto et al. | |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,254,425 B1 | 8/2012 | Raring | |
| 8,259,769 B1 | 9/2012 | Raring et al. | |
| 8,284,810 B1 | 10/2012 | Sharma et al. | |
| 8,294,179 B1 | 10/2012 | Raring | |
| 8,314,429 B1 | 11/2012 | Raring et al. | |
| 8,350,273 B2 | 1/2013 | Vielemeyer | |
| 8,351,478 B2 | 1/2013 | Raring et al. | |
| 8,355,418 B2 | 1/2013 | Raring et al. | |
| 8,416,825 B1 | 4/2013 | Raring | |
| 8,422,525 B1 | 4/2013 | Raring et al. | |
| 8,427,590 B2 | 4/2013 | Raring et al. | |
| 8,451,876 B1 | 5/2013 | Raring et al. | |
| 2001/0048114 A1 | 12/2001 | Morita et al. | |
| 2002/0027933 A1 | 3/2002 | Tanabe et al. | |
| 2002/0050488 A1 | 5/2002 | Nikitin et al. | |
| 2002/0085603 A1 | 7/2002 | Okumura | |
| 2002/0105986 A1 | 8/2002 | Yamasaki | |
| 2002/0158265 A1 * | 10/2002 | Eisenbeiser | 257/98 |
| 2002/0171092 A1 | 11/2002 | Goetz et al. | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0129810 A1 | 7/2003 | Barth et al. | |
| 2003/0140846 A1 | 7/2003 | Biwa et al. | |
| 2003/0178617 A1 | 9/2003 | Appenzeller et al. | |
| 2003/0200931 A1 | 10/2003 | Goodwin | |
| 2003/0216011 A1 | 11/2003 | Nakamura et al. | |
| 2004/0025787 A1 | 2/2004 | Selbrede et al. | |
| 2004/0060518 A1 | 4/2004 | Nakamura et al. | |
| 2004/0099213 A1 | 5/2004 | Adomaitis et al. | |
| 2004/0104391 A1 | 6/2004 | Maeda et al. | |
| 2004/0146264 A1 | 7/2004 | Auner et al. | |
| 2004/0151222 A1 | 8/2004 | Sekine | |
| 2004/0196877 A1 | 10/2004 | Kawakami et al. | |
| 2004/0222357 A1 | 11/2004 | King et al. | |
| 2004/0233950 A1 | 11/2004 | Furukawa et al. | |
| 2004/0247275 A1 | 12/2004 | Vakhshoori et al. | |
| 2004/0262624 A1 | 12/2004 | Akita et al. | |
| 2005/0040384 A1 | 2/2005 | Tanaka et al. | |
| 2005/0072986 A1 | 4/2005 | Sasaoka | |
| 2005/0168564 A1 | 8/2005 | Kawaguchi et al. | |
| 2005/0214992 A1 | 9/2005 | Chakraborty et al. | |
| 2005/0218413 A1 | 10/2005 | Matsumoto et al. | |
| 2005/0224826 A1 | 10/2005 | Keuper et al. | |
| 2005/0229855 A1 | 10/2005 | Raaijmakers | |
| 2005/0230701 A1 | 10/2005 | Huang | |
| 2005/0247260 A1 | 11/2005 | Shin et al. | |
| 2005/0285128 A1 | 12/2005 | Scherer et al. | |
| 2005/0286591 A1 | 12/2005 | Lee | |
| 2006/0030738 A1 | 2/2006 | Vanmaele et al. | |
| 2006/0033009 A1 | 2/2006 | Kobayashi et al. | |
| 2006/0037529 A1 | 2/2006 | D'Evelyn | |
| 2006/0038193 A1 | 2/2006 | Wu et al. | |
| 2006/0060131 A1 | 3/2006 | Atanackovic | |
| 2006/0066319 A1 | 3/2006 | Dallenbach et al. | |
| 2006/0077795 A1 | 4/2006 | Kitahara et al. | |
| 2006/0078022 A1 | 4/2006 | Kozaki et al. | |
| 2006/0079082 A1 | 4/2006 | Bruhns et al. | |
| 2006/0086319 A1 | 4/2006 | Kasai et al. | |
| 2006/0118799 A1 | 6/2006 | D'Evelyn et al. | |
| 2006/0126688 A1 * | 6/2006 | Kneissl | 372/43.01 |
| 2006/0144334 A1 | 7/2006 | Yim et al. | |
| 2006/0175624 A1 | 8/2006 | Sharma et al. | |
| 2006/0189098 A1 | 8/2006 | Edmond | |
| 2006/0193359 A1 | 8/2006 | Kuramoto | |
| 2006/0205199 A1 | 9/2006 | Baker et al. | |
| 2006/0213429 A1 | 9/2006 | Motoki et al. | |
| 2006/0216416 A1 | 9/2006 | Sumakeris et al. | |
| 2006/0256482 A1 | 11/2006 | Araki et al. | |
| 2006/0288928 A1 | 12/2006 | Eom et al. | |
| 2007/0081857 A1 | 4/2007 | Yoon | |
| 2007/0086916 A1 | 4/2007 | LeBoeuf et al. | |
| 2007/0093073 A1 | 4/2007 | Farrell, Jr. et al. | |
| 2007/0101932 A1 | 5/2007 | Schowalter et al. | |
| 2007/0110112 A1 | 5/2007 | Sugiura | |
| 2007/0120141 A1 | 5/2007 | Moustakas et al. | |
| 2007/0153866 A1 | 7/2007 | Shchegrov et al. | |
| 2007/0163490 A1 | 7/2007 | Habel et al. | |
| 2007/0166853 A1 | 7/2007 | Guenther et al. | |
| 2007/0184637 A1 | 8/2007 | Haskell et al. | |
| 2007/0217462 A1 | 9/2007 | Yamasaki | |
| 2007/0242716 A1 | 10/2007 | Samal et al. | |
| 2007/0252164 A1 | 11/2007 | Zhong et al. | |
| 2007/0259464 A1 | 11/2007 | Bour et al. | |
| 2007/0272933 A1 | 11/2007 | Kim et al. | |
| 2007/0280320 A1 | 12/2007 | Feezell et al. | |
| 2008/0029152 A1 | 2/2008 | Milshtein et al. | |
| 2008/0087919 A1 | 4/2008 | Tysoe et al. | |

(56) References Cited

U.S. PATENT DOCUMENTS

| | | |
|---|---|---|
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1* | 8/2008 | Feezell et al. ............. 257/13 |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1* | 11/2008 | Ohta et al. ............. 372/44.011 |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101079463 | 11/2007 |
| CN | 101099245 | 1/2008 |
| CN | 101171692 | 4/2008 |
| JP | 3-287770 | 12/1991 |
| JP | 2007-173467 A | 7/2007 |
| JP | 2007-068398 | 4/2008 |
| WO | WO 2004/084275 | 9/2004 |
| WO | WO2008-041521 | 4/2008 |
| WO | WO 2010/120819 | 10/2010 |

OTHER PUBLICATIONS

International Search Report of PCT Application No. PCT/US2009/047107, dated Sep. 29, 2009, 4 pages total.
International Search Report of PCT Application No. PCT/US2009/046786, dated May 13, 2010, 2 pages total.
International Search Report of PCT Application No. PCT/US2009/52611, dated Sep. 29, 2009, 3 pages total.
International Search Report & Written Opinion of PCT Application No. PCT/US2010/030939, dated Jun. 16, 2010, 9 pages total.
International Search Report & Written Opinion of PCT Application No. PCT/US2010/049172, dated Nov. 17, 2010, 7 pages total.
International Search Report of PCT Application No. PCT/US2011/037792, dated Sep. 8, 2011, 2 pages total.
Yoshizumi et al., 'Continuous-Wave Operation of 520 nm Green InGaN-Based Laser Diodes on Semi-Polar {2021} GaN Substrates,' Applied Physics Express, vol. 2, 2009, pp. 092101-1-092101-3.
USPTO Office Action for U.S. Appl. No. 12/484,924 dated Oct. 31, 2011.
USPTO Office Action for U.S. Appl. No. 12/497,289 dated Feb. 2, 2012.
USPTO Office Action for U.S. Appl. No. 12/749,466 dated Feb. 3, 2012.
USPTO Office Action for U.S. Appl. No. 12/759,273 dated Nov. 21, 2011.
USPTO Office Action for U.S. Appl. No. 12/762,269 dated Oct. 12, 2011.
USPTO Office Action for U.S. Appl. No. 12/762,271 dated Dec. 23, 2011.
USPTO Notice of Allowance for U.S. Appl. No. 12/762,278 dated Nov. 7, 2011.
USPTO Office Action for U.S. Appl. No. 12/778,718 dated Nov. 25, 2011.
USPTO Office Action for U.S. Appl. No. 12/573,820 dated Oct. 11, 2011.
USPTO Office Action for U.S. Appl. No. 13/046,565 dated Nov. 7, 2011.
USPTO Office Action for U.S. Appl. No. 13/046,565 dated Feb. 2, 2012.
Founta et al., 'Anisotropic Morphology of Nonpolar a-Plane GaN Quantum Dots and Quantum Wells,' Journal of Applied Physics, vol. 102, 2007, pp. 074304-1-074304-6.

(56) References Cited

OTHER PUBLICATIONS

USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
Adesida et al., 'Characteristics of chemically assisted ion beam etching of gallium nitride', Applied Physics Letters, vol. 65, No. 7, 1994, pp. 889-891.
Behfar et al., 'Progress in Etched Facet Technology for GaN and Blue Lasers', Proc. of SPIE., vol. 6473, 64731F, 2007, pp. 1-8.
International Preliminary Report & Written Opinion of PCT Application No. PCT/US2011/060030 dated Mar. 21, 2012, 11 pgs. total.
USPTO Notice of Allowance for U.S. Appl. No. 12/749,466 dated Jan. 2, 2013.
USPTO Office Action for U.S. Appl. No. 12/787,343 dated Dec. 17, 2012.
USPTO Notice of Allowance for U.S. Appl. No. 12/787,343 dated Jun. 10, 2013.
USPTO Notice of Allowance for U.S. Appl. No. 12/789,303 dated Dec. 21, 2012.
USPTO Office Action for U.S. Appl. No. 12/868,441 dated Dec. 18, 2012.
USPTO Office Action for U.S. Appl. No. 13/114,806 dated Apr. 12, 2013.
USPTO Office Action for U.S. Appl. No. 13/291,922 dated Jun. 18, 2013.
USPTO Office Action for U.S. Appl. No. 13/548,635 dated Jun. 14, 2013.
USPTO Notice of Allowance for U.S. Appl. No. 13/606,894 dated May 24, 2013.
Chinese Office Action From Chinese Patent Application No. 200980134723.8 dated Nov. 1, 2012, 22 pgs. (With Translation).
Franssila, 'Tools for CVD and Epitaxy', Introduction to Microfabrication, 2004, pp. 329-336.
USPTO Notice of Allowance for U.S. Appl. No. 12/502,058 dated Jul. 19, 2012.
USPTO Office Action for U.S. Appl. No. 12/749,466 dated Jul. 3, 2012.
USPTO Office Action for U.S. Appl. No. 12/759,273 dated Jun. 26, 2012.
USPTO Notice of Allowance for U.S. Appl. No. 12/762,271 dated Aug. 8, 2012.
USPTO Office Action for U.S. Appl. No. 12/789,303 dated Sep. 24, 2012.
USPTO Office Action for U.S. Appl. No. 12/859,153 dated Sep. 25, 2012.
USPTO Notice of Allowance for U.S. Appl. No. 12/880,803 dated Jul. 18, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
USPTO Office Action for U.S. Appl. No. 12/884,993 dated Aug. 2, 2012.
USPTO Notice of Allowance for U.S. Appl. No. 12/884,993 dated Nov. 26, 2012.
USPTO Office Action for U.S. Appl. No. 12/995,946 dated Mar. 28, 2012.
USPTO Office Action for U.S. Appl. No. 13/046,565 dated Jul. 19, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
International Preliminary Report & Written Opinion of PCT Application No. PCT/US2011/037792, dated Sep. 8, 2011, 13 pages total.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
USPTO Office Action for U.S. Appl. No. 12/995,946 dated Jan. 29, 2013.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/859,153 dated Feb. 26, 2013.
USPTO Office Action for U.S. Appl. No. 12/942,817 dated Feb. 20, 2013.
USPTO Notice of Allowance for U.S. Appl. No. 13/108,645 dated Jan. 28, 2013.

(56) References Cited

OTHER PUBLICATIONS

USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.
Non-Final Office Action of Feb. 11, 2014 for U.S. Appl. No. 13/781,499, 12 pages.
Feezell et al. 'Development of nonpolar and semipolar InGaN/GaN visible light-emitting diodes', MRS Bulletin, vol. 34, May 2009, pp. 318-323.
International Search Report of PCT Application No. PCT/US2010/030939, dated Jun. 16, 2010, 9 pages total.
Communication from the Chinese Patent Office re 200980134723.8 dated Jun. 27, 2013, 19 pages.
USPTO Notice of Allowance for U.S. Appl. No. 12/868,441 dated Sep. 18, 2013, 13 pages.
USPTO Office Action for U.S. Appl. No. 13/114,806 dated Aug. 26, 2013, 22 pages.
U.S. Appl. No. 12/497,289, filed Jul. 2, 2009, Raring et al., unpublished.
Abare "Cleaved and Etched Facet Nitride Laser Diodes," IEEE Journal of Selected Topics in Quantum Electronics, vol. 4, No. 3, pp. 505-509 (May 1998).
Aoki et al., "InGaAs/InGaAsP MQW Electroabsorption Modulator Integrated with a DFB Laser Fabricated by Band-Gap Energy Control Selective Area MOCVD, 1993," IEEE J Quantum Electronics, vol. 29, pp. 2088-2096.
Asano et al., "100-mW kink-Free Blue-Violet Laser Diodes with Low Aspect Ratio," 2003, IEEE Journal of Quantum Electronics, vol. 39, No. 1, pp. 135-140.
Asif Khan "Cleaved cavity optically pumped InGaN—GaN laser grown on spinel substrates," Appl. Phys. Lett. 69 (16), pp. 2418-2420 (Oct. 14, 1996).
Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Gardner et al. "Blue-emitting InGaN—GaN double-heterostructure light-emitting diodes reaching maximum quantum efficiency above 200 A/ cm2", Applied Physics Letters 91, 243506 (2007).
hap ://techon.nikkeibp. co jp/english/NEWS_EN/20080122/146009, Jan. 2008.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Park, "Crystal orientation effects on electronic properties of wurtzite InGaN/GaN quantum wells,",Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).

(56) References Cited

OTHER PUBLICATIONS

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

\* cited by examiner

Figure 1

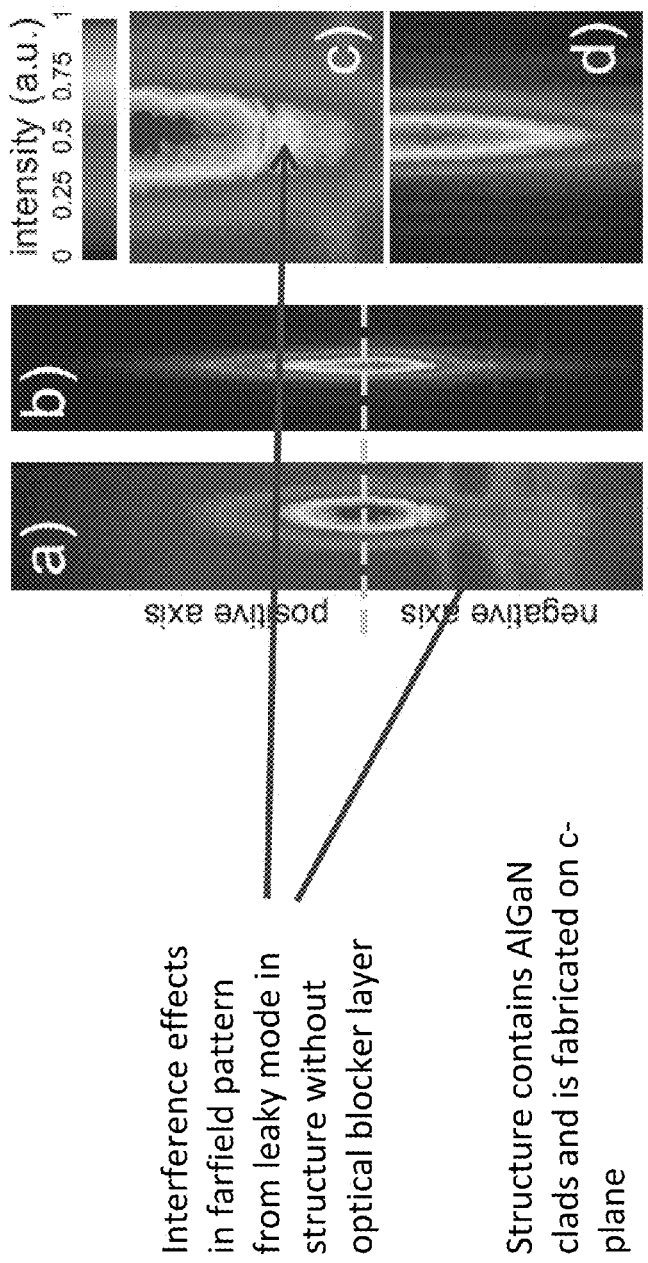

Interference effects in farfield pattern from leaky mode in structure without optical blocker layer Structure contains AlGaN clads and is fabricated on c-plane A. Castiglia, J.-F. Carlin, E. Feltin, G. Cosendey, J. Dorsaz, and N. Grandjean, "Emission characteristics of GaN-based blue lasers including a lattice matched Al0.83In0.17N optical blocking layer for improved optical beam quality," APL 97, 111104 2010

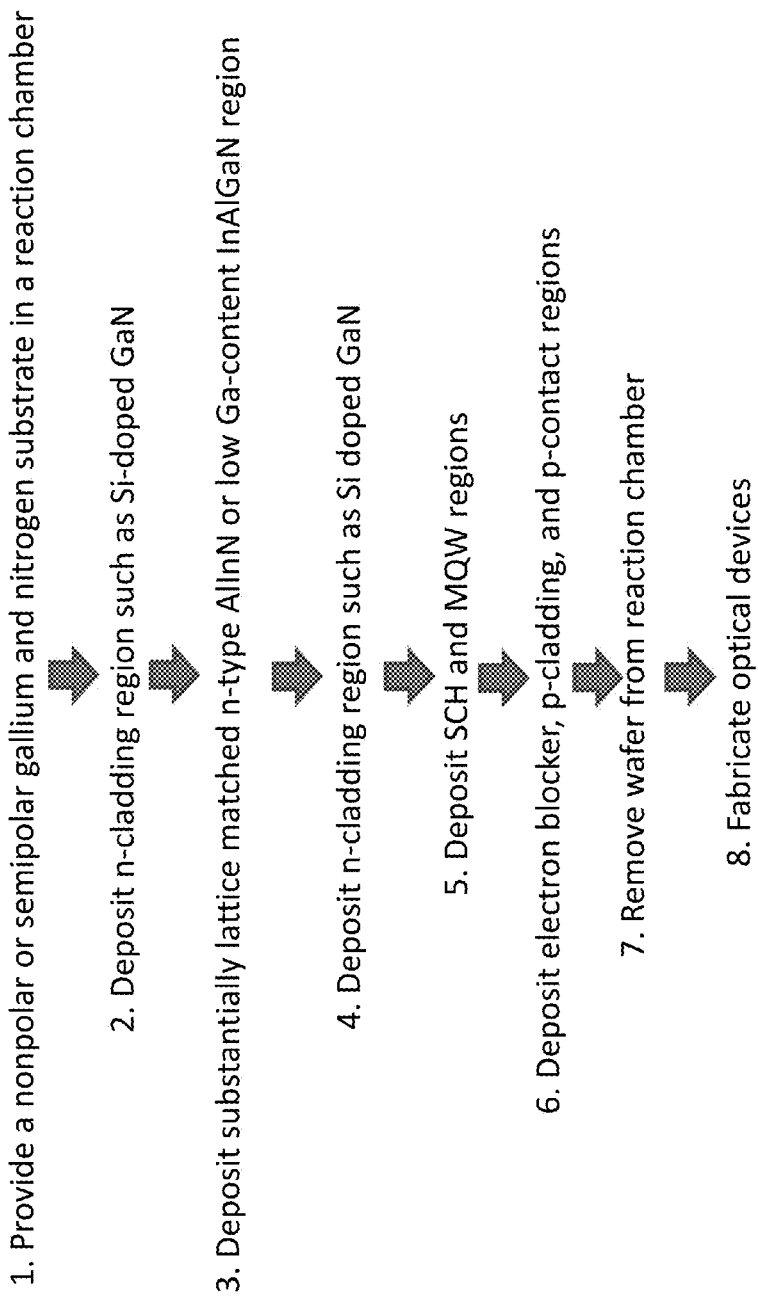
Figure 2: Process flow diagram

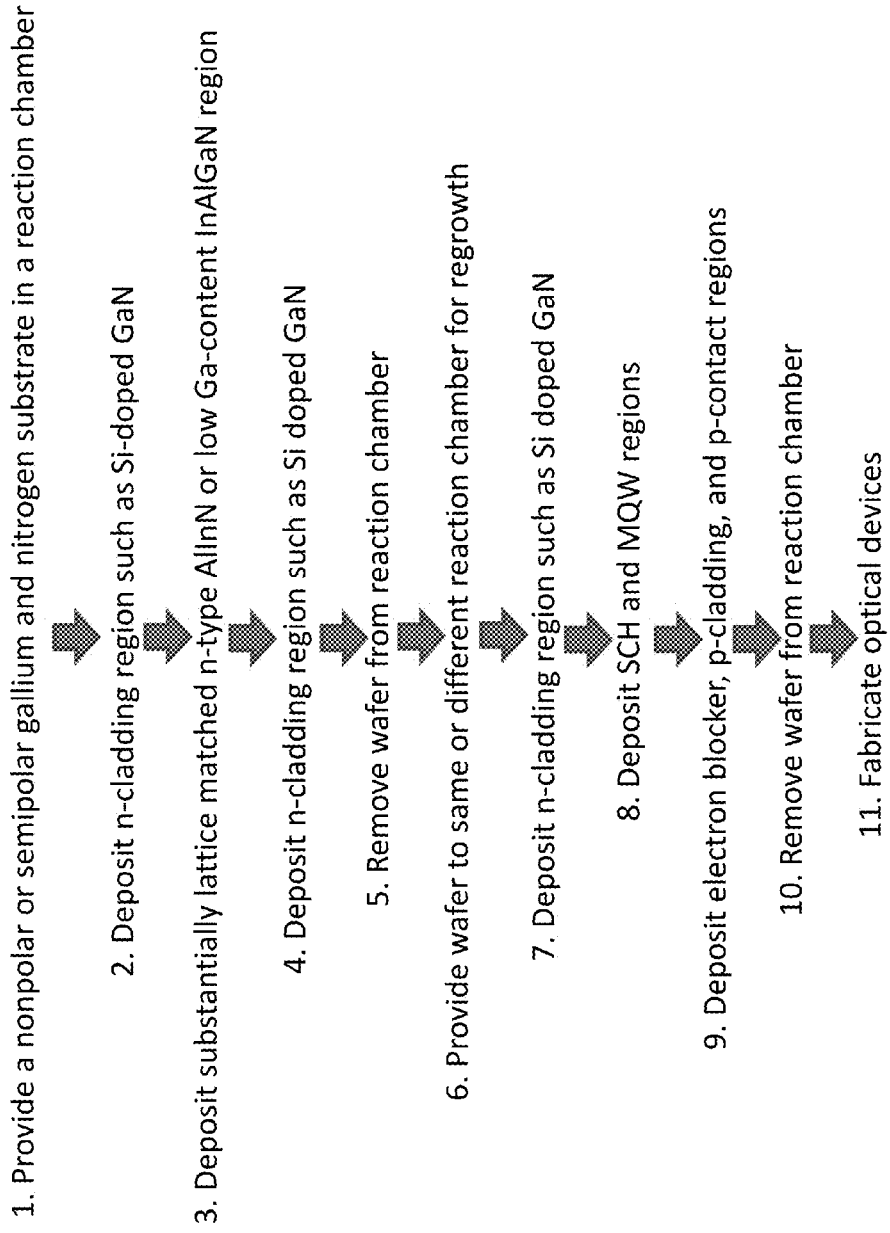

Figure 3: Process flow diagram with regrowth

1. Provide a nonpolar or semipolar gallium and nitrogen substrate in a reaction chamber
2. Deposit n-cladding region such as Si-doped GaN
3. Deposit substantially lattice matched n-type AlInN or low Ga-content InAlGaN region
4. Deposit n-cladding region such as Si doped GaN
5. Remove wafer from reaction chamber
6. Provide wafer to same or different reaction chamber for regrowth
7. Deposit n-cladding region such as Si doped GaN
8. Deposit SCH and MQW regions
9. Deposit electron blocker, p-cladding, and p-contact regions
10. Remove wafer from reaction chamber
11. Fabricate optical devices

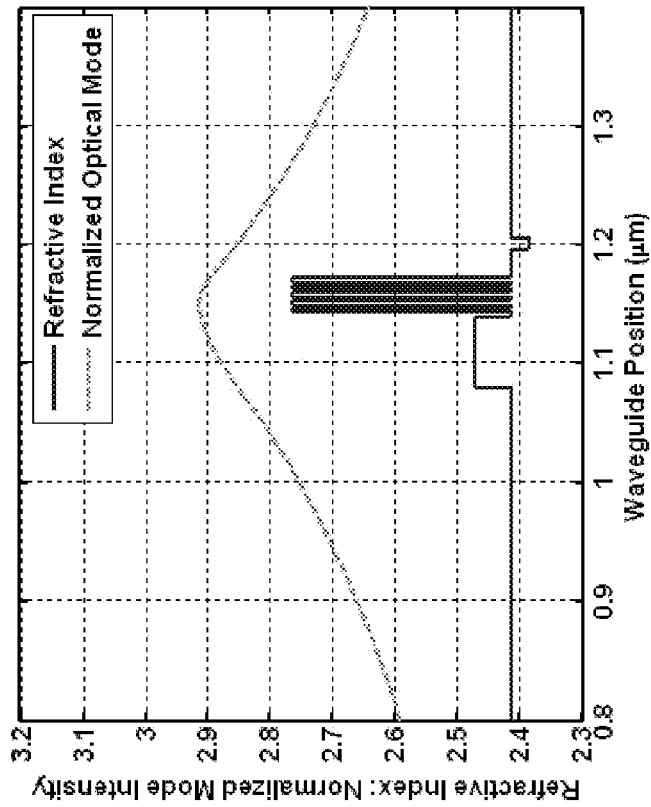
Fig 4. Baseline Design
- 5 InGaN QWs
- 6 GaN Barriers
- 60nm InGaN Lower SCH
- 20nm GaN upper guiding layer
- 15nm AlGaN EBL

Fig. 5 Add InAlN below Baseline: 1
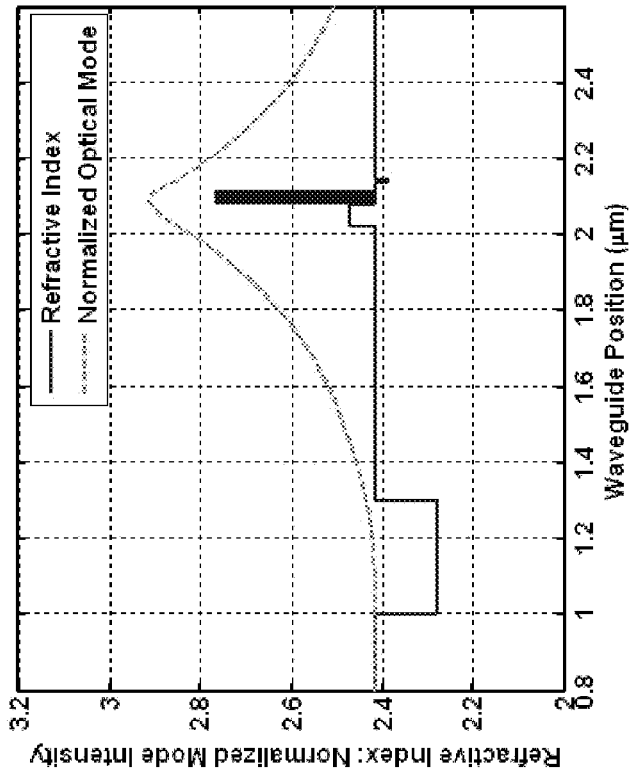
MQW Confinement ~ 5.0%
pGaN Confinement ~37%
- Modifications
  - Add 700nm nGaN below SCH
  - Add 300nm substantially lattice matched InAlN below nGaN
- Effect
  - No change in modal gain
  - No change in modal loss associated with pGaN
  - Reduced loss from less parasitic mode leakage into nGaN
- Assessment
  - Good baseline design to prevent leakage

Fig. 6. Add InAlN below Baseline: 2
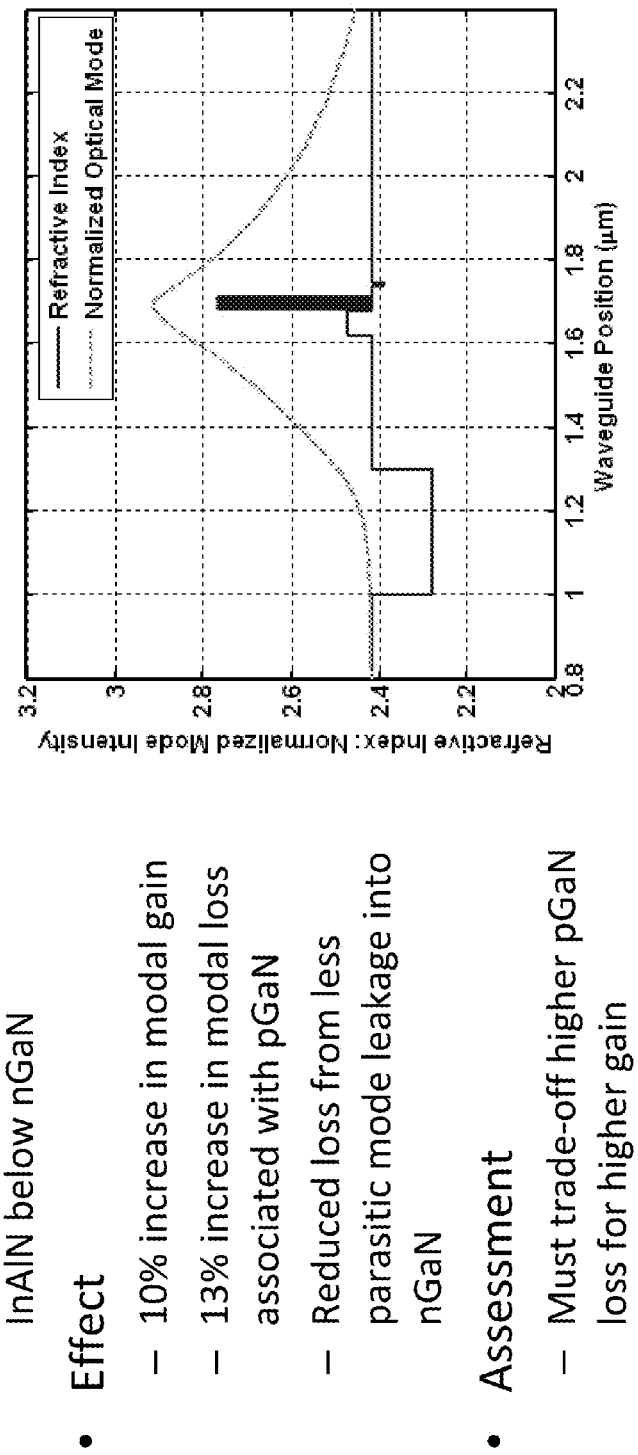
MQW Confinement ~ 5.5%
pGaN Confinement ~43%
- Modifications
  - Add 300nm nGaN below SCH
  - Add 300nm lattice matched InAlN below nGaN
- Effect
  - 10% increase in modal gain
  - 13% increase in modal loss associated with pGaN
  - Reduced loss from less parasitic mode leakage into nGaN
- Assessment
  - Must trade-off higher pGaN loss for higher gain

Fig. 7 HS-SCH Baseline Design
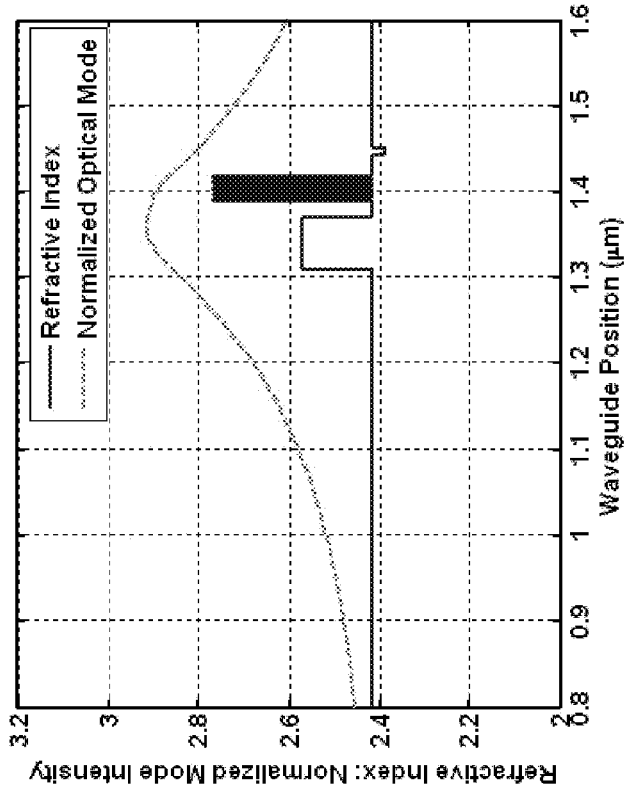
MQW Confinement ~ 5.8%
pGaN Confinement ~28%
- Modifications
  - Add 15nm SCL below lower barrier
  - Add 60nm 13% InGaN HS-SCH below SCL
- Effect
  - 16% increase in modal gain
  - 26% reduction in modal loss associated with pGaN
- Assessment
  - Increases gain and should reduce pGaN loss, but parasitic mode leakage will still exist

Fig. 8 Add InAlN Blocker below HS-SCH: 1

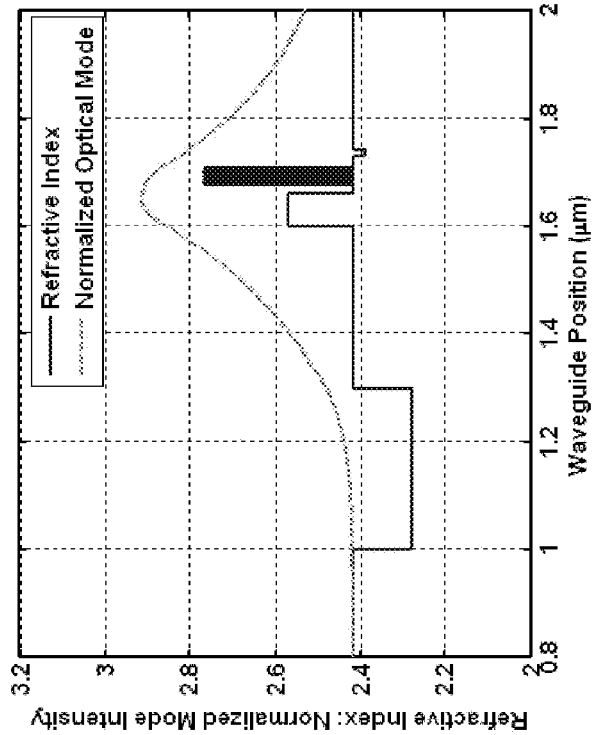

MQW Confinement ~ 6.0%
pGaN Confinement ~29%

- Modifications
  - Add 300nm nGaN below HS-SCH
  - Add 300nm lattice matched InAlN below nGaN

- Effect
  - 20% increase in modal gain over baseline
  - 23% reduction in modal loss associated with pGaN
  - Reduced loss from less parasitic mode leakage into nGaN

- Assessment
  - Increased gain and reduced pGaN loss along with reduced parasitic mode leakage

Fig. 9 Add InAlN Blocker below HS-SCH: 2

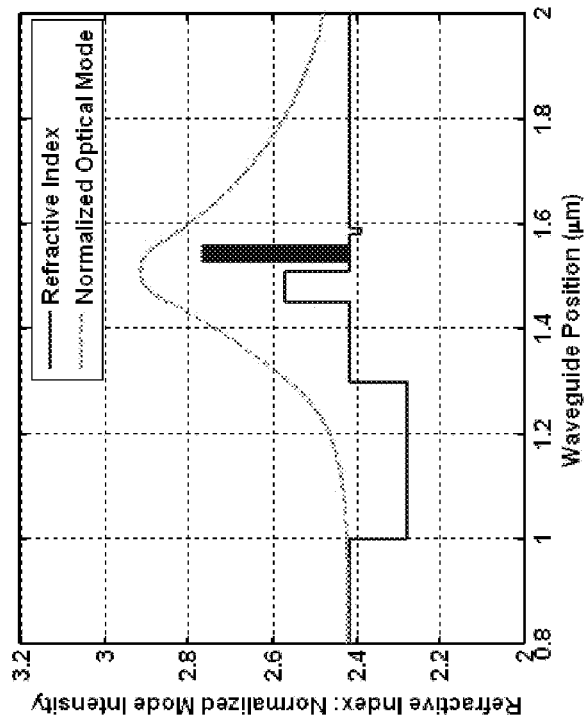

MQW Confinement ~ 6.5%
pGaN Confinement ~34%

- Modifications
  - Remove standard nSCH
  - Add 150nm nGaN below HS-SCH
  - Add 300nm lattice matched InAlN below nGaN

- Effect
  - 30% increase in modal gain
  - 10% reduction in modal loss associated with pGaN
  - Reduced loss from less parasitic mode leakage into nGaN

- Assessment
  - Such structure has potential to reduce pGaN loss and leakage loss while increasing gain

Fig. 10 Add InAlN Blocker below HS-SCH: 3

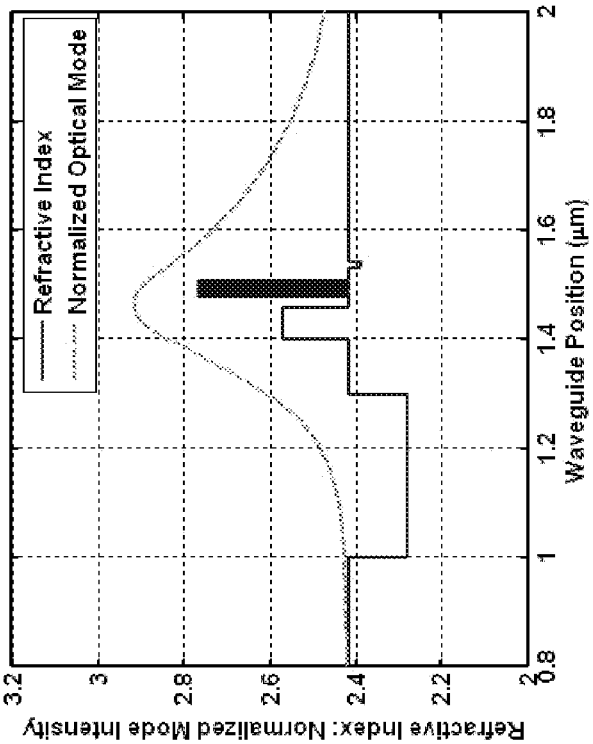

MQW Confinement ~ 6.7%
pGaN Confinement ~38%

- Modifications
  - Remove standard nSCH
  - Add 150nm nGaN below HS-SCH
  - Add 300nm lattice matched InAlN below nGaN
- Effect
  - 34% increase in modal gain
  - No change in modal loss associated with pGaN
  - Reduced loss from less parasitic mode leakage into nGaN
- Assessment
  - Such structure has potential to reduce pGaN loss and leakage loss while increasing gain

Fig. 11 Near Lattice matched AlInN on (20-21)
Reciprocal Space Map of 300nm AlInN on (20-21)
1. Peaks are selected by semi automatic peak search.
2. "Almost" lattice match because there is slight peak misalignment
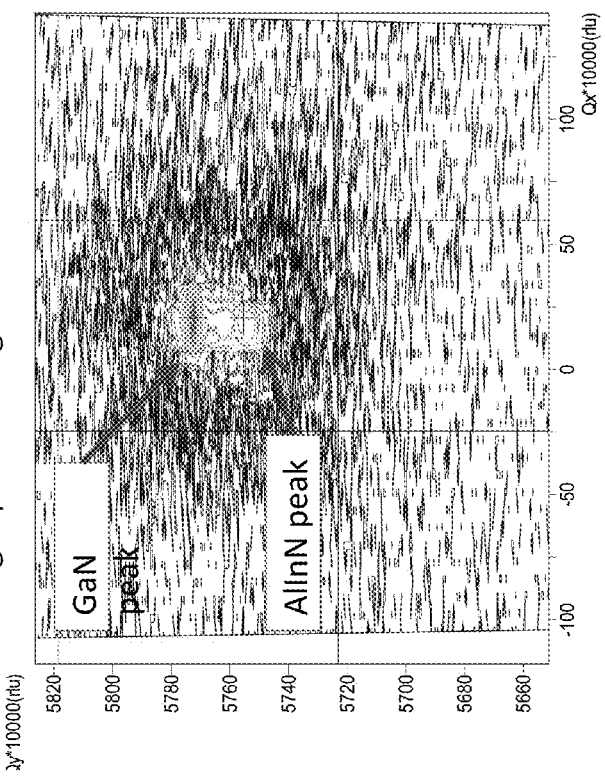
Optical image of AlInN on (20-21)
1. Smooth morphology
2. Suitable for growth of laser diode
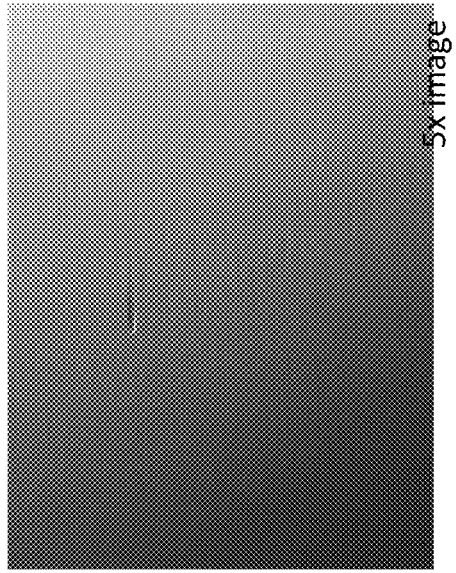

Fig. 12a Growth Rate and Morphology
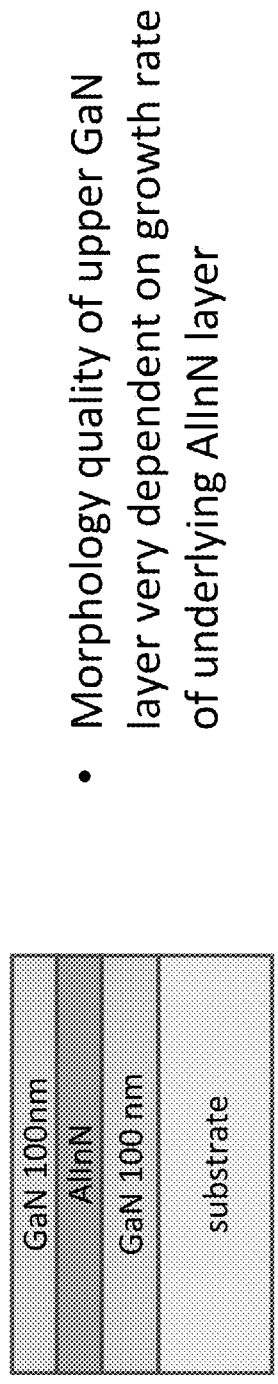
- Morphology quality of upper GaN layer very dependent on growth rate of underlying AlInN layer
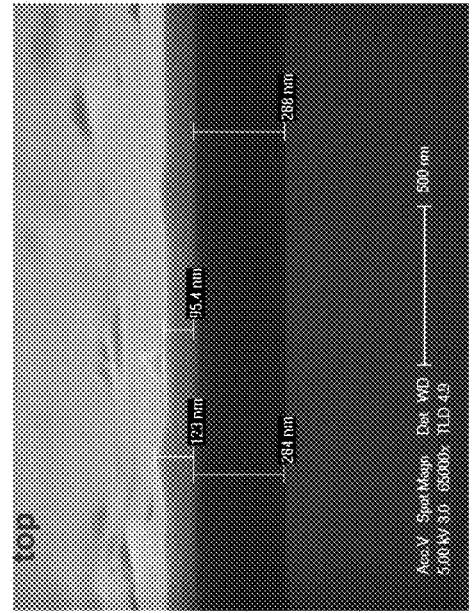
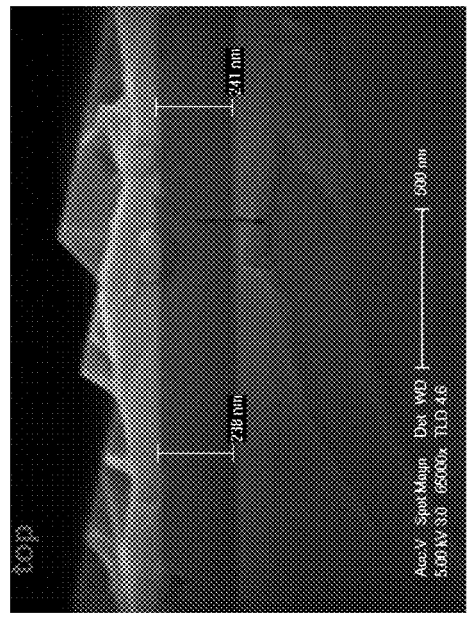

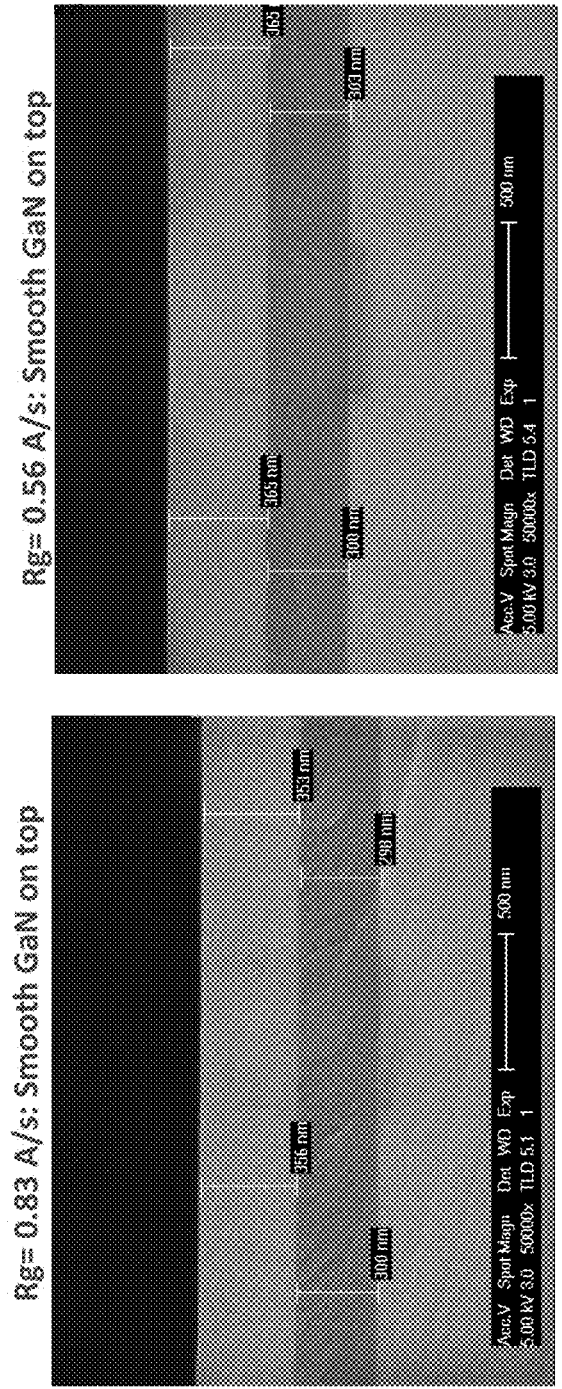
Fig. 12b Growth Rate and Morphology
- With slow growth rates below 1 A/s we achieve smooth GaN overgrowth on the thick AlInN layer
→ Ideal for growth of laser diode active region and waveguide above

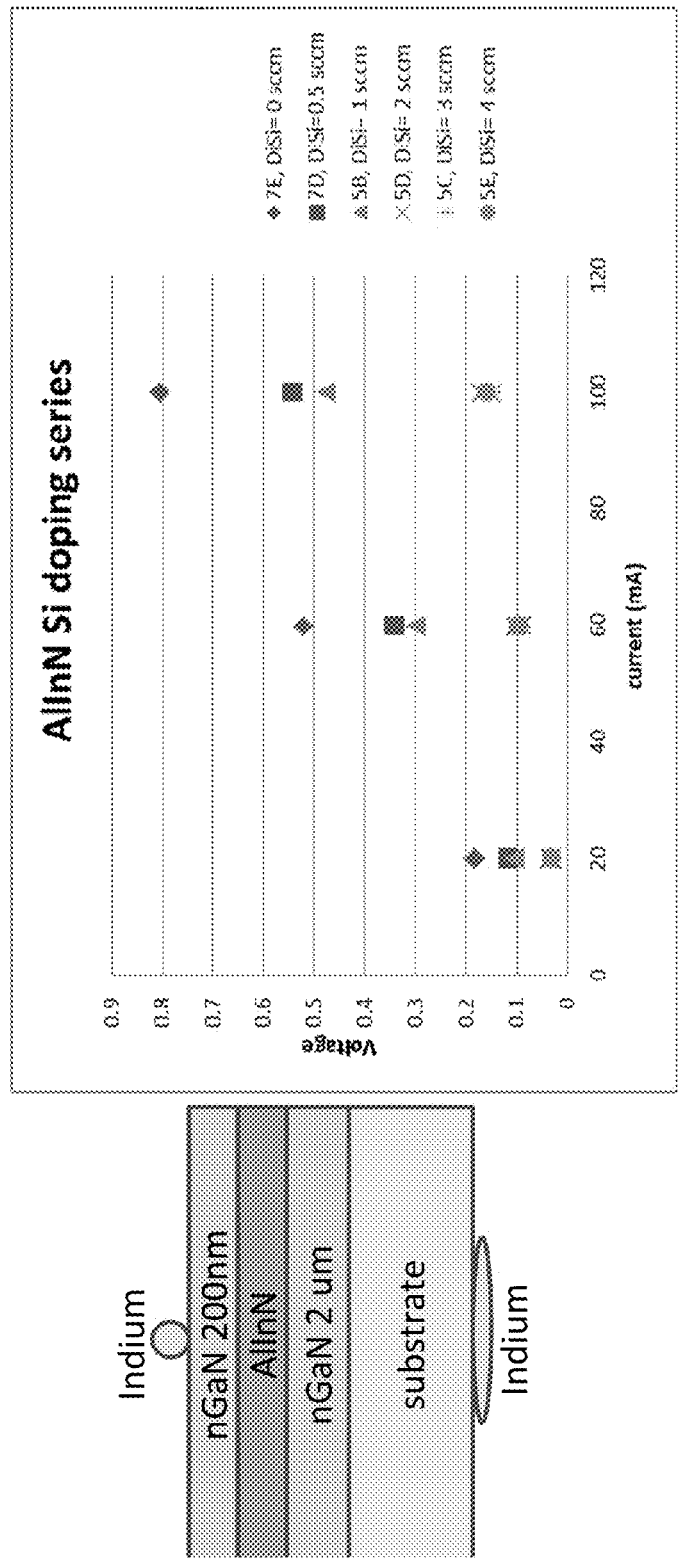
Fig. 13 n-type doping in optical blocking layer for low resistance
→ DiSi doping flow of >1-2 sccm for low resistance

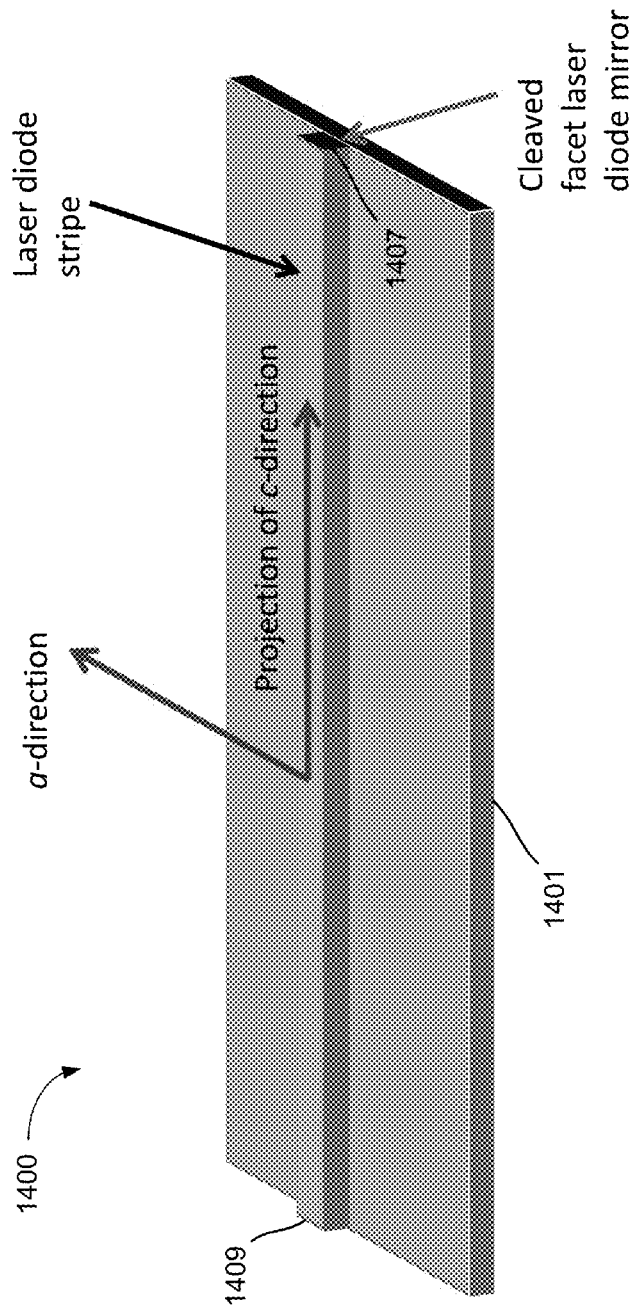
Figure 14: Projection of c-direction laser diode on {20-21} GaN substrate with cleaved mirror

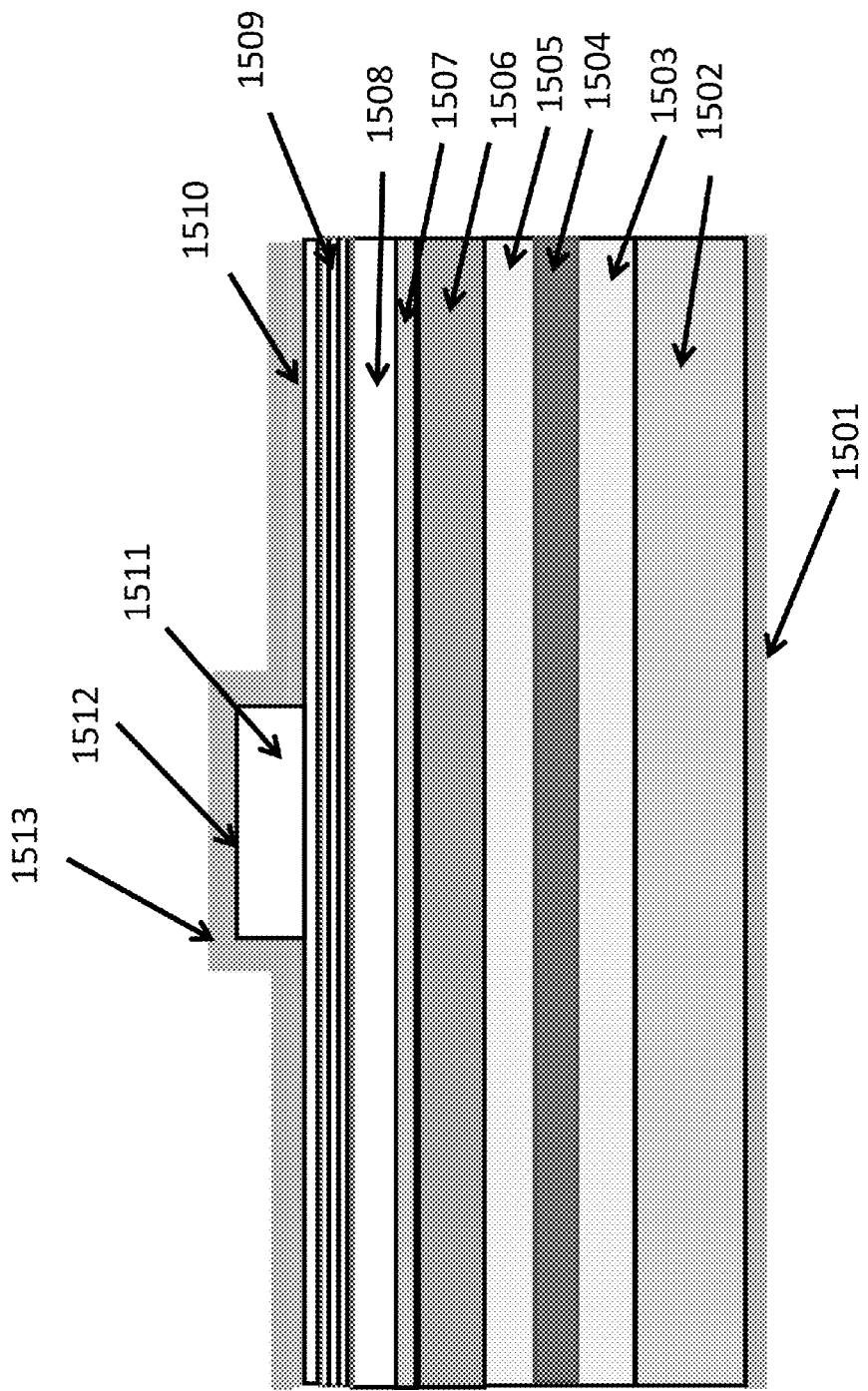
Figure 15a – Cross-sectional view of semipolar laser diode

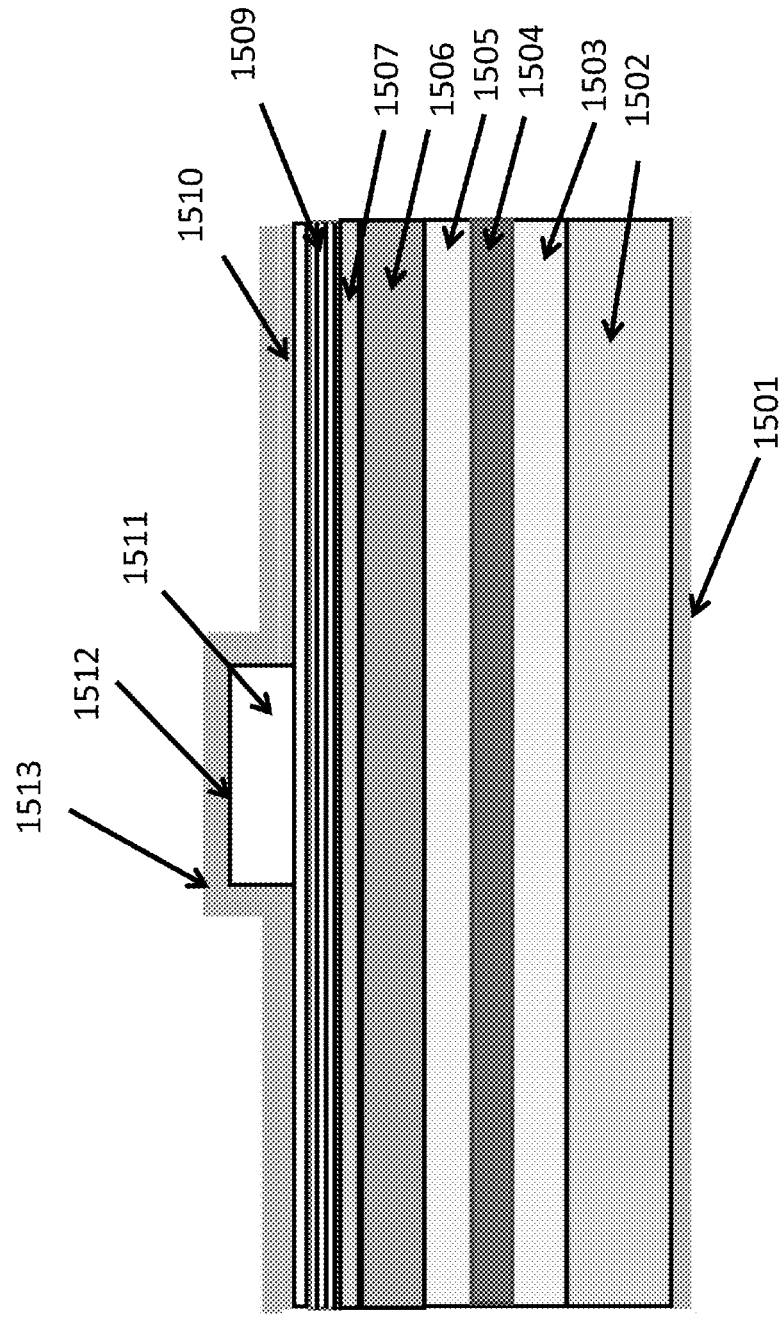
Figure 15b – Cross-sectional view of semipolar laser diode

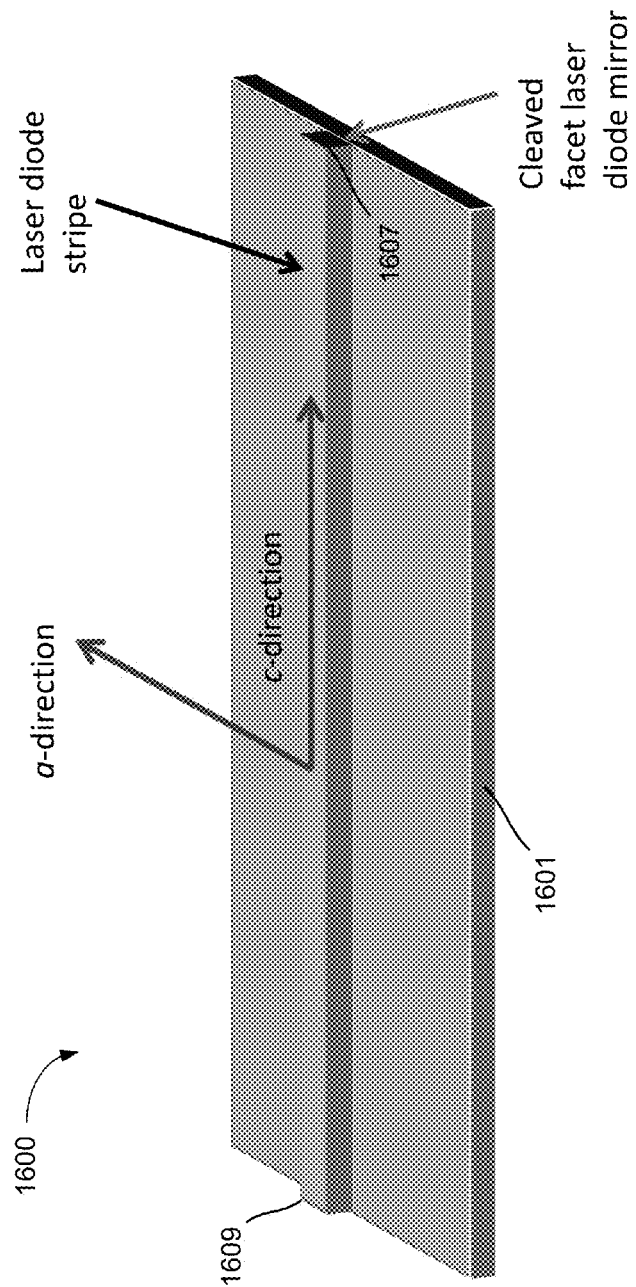
Figure 16: c-direction laser diode on m-planeGaN substrate with cleaved mirror

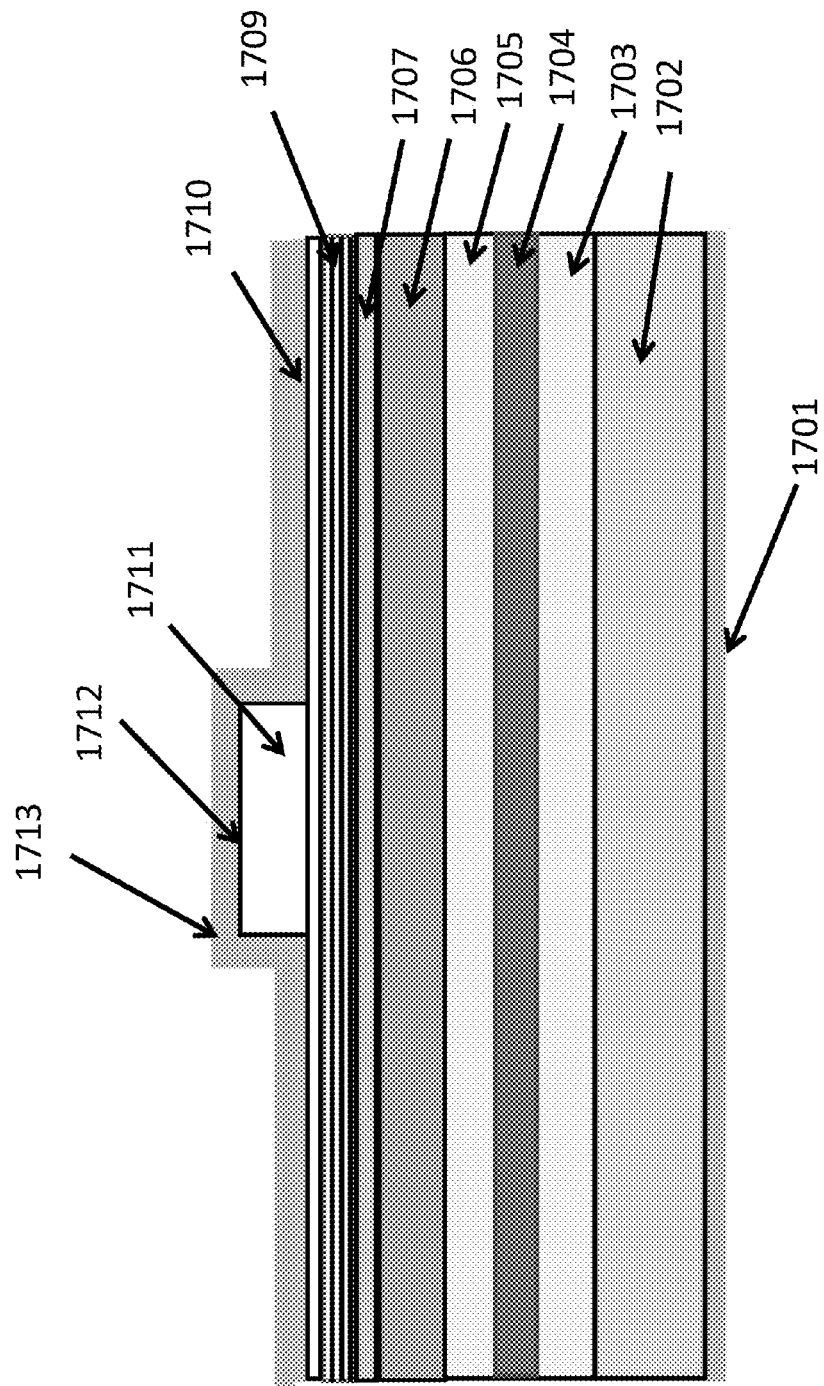
Figure 17 — Cross-sectional view of nonpolar laser diode

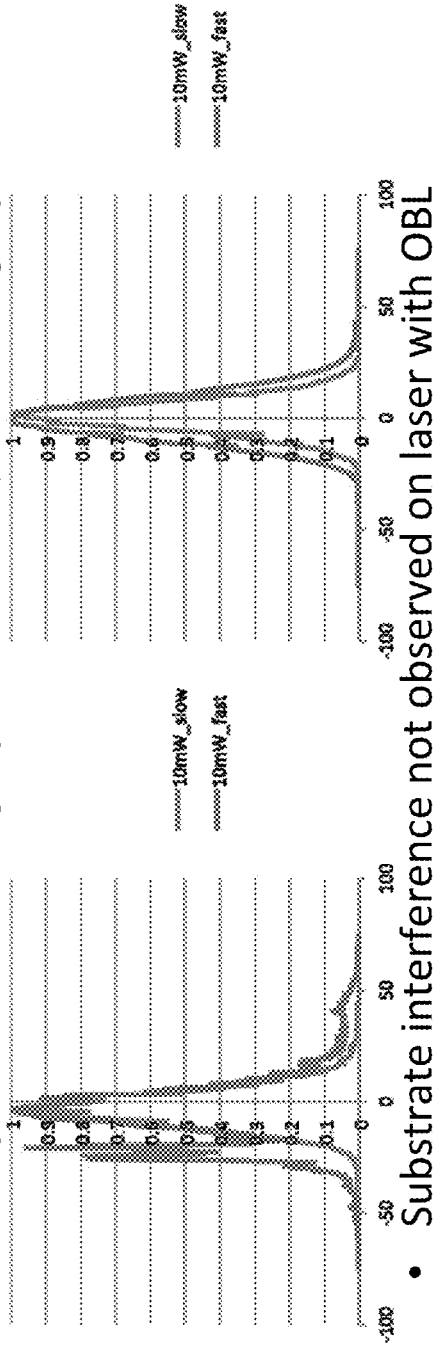
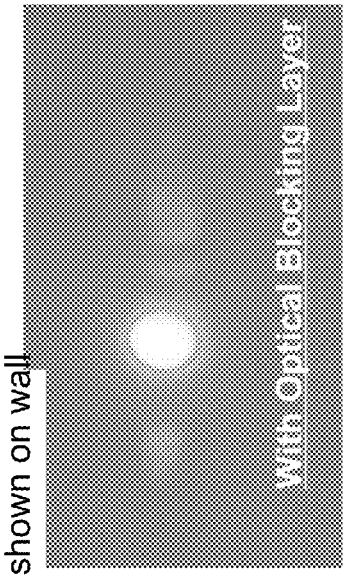
Figure 18: Optical Blocking Layer Effect on Farfield Pattern

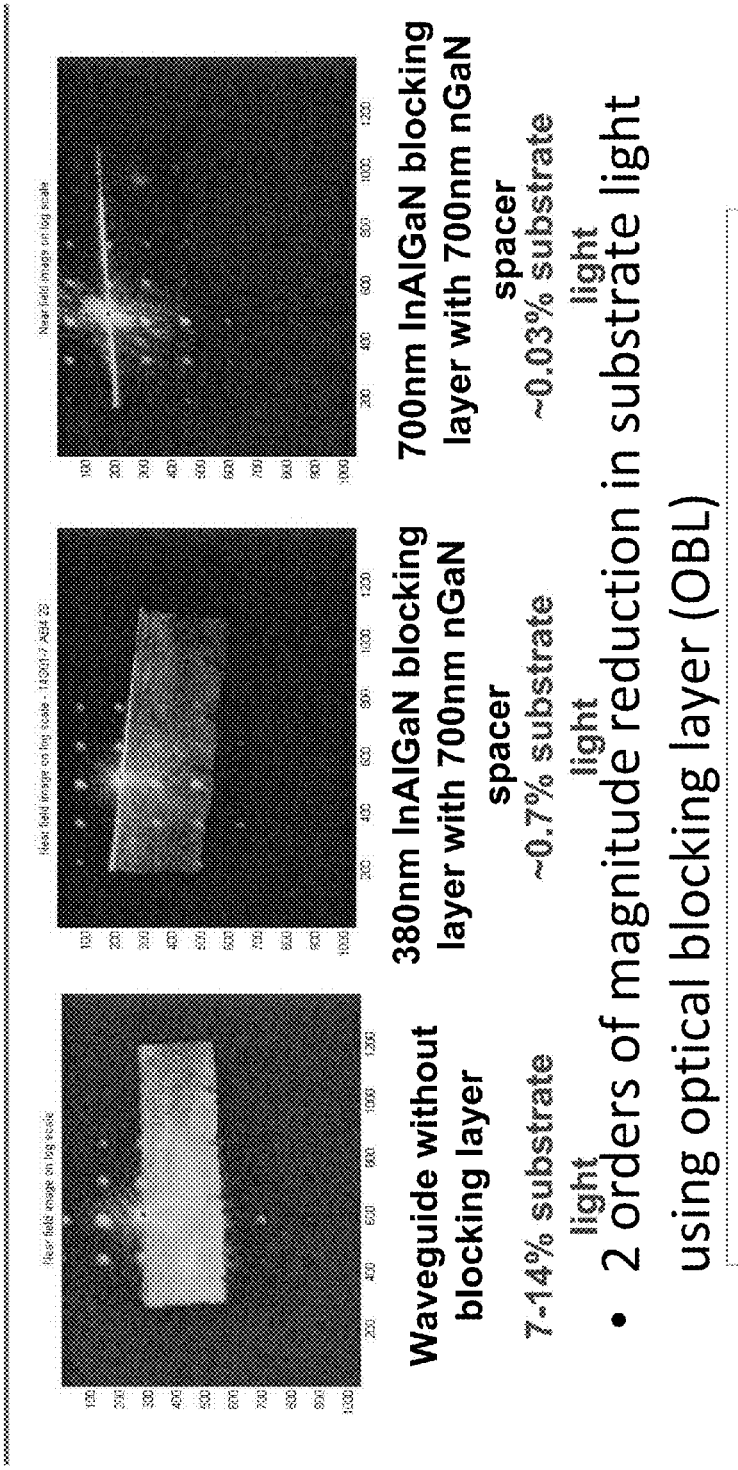
Figure 19: Optical Blocking Layer for substrate light reduction

METHOD AND STRUCTURE FOR LASER DEVICES USING OPTICAL BLOCKING REGIONS

CROSS-REFERENCE TO RELATED APPLICATION

This application claims priority to U.S. Provisional Application No. 61/436,042, filed Jan. 25, 2011, which is incorporated by reference herein in its entirety for all purposes.

BACKGROUND OF THE INVENTION

The present invention is directed to optical devices and related methods. In particular, the present invention provides a method and device for emitting electromagnetic radiation using nonpolar or semipolar gallium containing substrates such as GaN, AN, InN, InGaN, AlGaN, and AlInGaN, and others. More particularly, the present invention provides a method and device using a gallium and nitrogen containing substrate configured on the {20-21} family of planes or an off-cut of the {20-21} family of planes towards the plus or minus c-plane and/or towards the a-plane. Still more particularly, the invention provides a method and resulting structures that use an optical blocking region configured to provide desired optical properties in devices such as laser diodes. The invention can be applied to optical devices, lasers, light emitting diodes, solar cells, photoelectrochemical water splitting and hydrogen generation, photodetectors, integrated circuits, and transistors, as well as other devices.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

From the above, it is seen that techniques for improving optical devices are desired.

BRIEF SUMMARY OF THE INVENTION

Optical blocking layers (in this case formed from AlInN or low Ga content AlInGaN) can be used to reduce parasitic waveguide leakage, which can reduce the optical loss and result in improved laser diode performance. Further, the reduced leakage of light from the waveguide would improve the optical beam quality from the laser diode by reducing any the amount of light in the substrate and by mitigating interference effects such as fringing patterns and noisy far-field patterns. Finally, through careful design the optical blocking layer can be strategically positioned relative to the core of the optical mode to manipulate the confinement in the multi-quantum well (MQW) active region to modify the modal gain and manipulate the confinement in the p-cladding to modify the loss.

As further background, AlInN optical blocking layers in GaN lasers are shown in FIG. 1. There are a few publications that discuss this concept in c-plane lasers and they usually also combine it with AlGaN claddings. An example of such publication is Castiglia et al. *Applied Physics Letters* 94, 193506 2009, which is hereby incorporated by reference. This invention provides blocking layers on nonpolar/semipolar substrates, and in some cases without conventional AlGaN or InAlGaN cladding layers and high indium content InGaN layers for improved wave guiding.

The present method and device includes:

1. Use of an optical blocking layer on nonpolar or semipolar substrates for the fabrication of optical devices;

2. Use of an optical blocking layer on nonpolar or semipolar substrates within laser diodes;

3. Use of an optical blocking layer on nonpolar or semipolar substrates within laser diodes that are free from conventional AlGaN or InAlGaN cladding layers;

4. Use of an optical blocking layer in combination with the high indium content or thick InGaN layer technology on nonpolar or semipolar substrates within laser diodes (an example of the high indium content or thick InGaN can be found in U.S. Provisional Application No. 61/410,794 filed Nov. 5, 2010, commonly assigned, and hereby incorporated by reference herein);

5. Use of an optical blocking layer in combination with the high indium content or thick InGaN layer technology on nonpolar or semipolar substrates within laser diodes that are free from conventional AlGaN or InAlGaN cladding layers.

In a specific embodiment, the present method and device includes an optical blocking region, which has suitable properties. As an example, the optical blocking region can include AlInN or low Ga content InAlGaN optical blocking layer(s). In a specific embodiment, the optical blocking region can include one or more of the following properties.

Optically smooth (e.g., predetermined surface roughness RMS and less) in morphology;

Theoretical index of refraction is dependent on wavelength, exact composition, and material parameters used to compute the index;

For green wavelength regime of 505 to 545 nm, the index is between about 2.2 and about 2.3 or is between about 2.28 and about 2.38;

For blue wavelength regime of 430 to 480 nm, the index is between about 2.25 and about 2.35 or is between about 2.35 and about 2.45;

Precise composition of lattice matched Al(1−x)In(x)N varies based on crystal orientation. As an example, for c-plane, the lattice matched film is about x=0.17 (or 17% indium) and (1−x)=0.83 (or 83% aluminum). On nonpolar and semipolar crystal orientations, the growth films can never be exactly lattice matched due to the different c/a ratios for GaN, AN, and InN, where the "c" and "a" values are the lattice constants of the unit cells in different directions.

The AlInN film or low Ga-content AlInGaN film can be strained either in compression or in tension as long as there is no gross cracking in the said film or in the films grown above, and the MQW active region can be grown above with high quality.

In a preferred embodiment, the present method and device include an InAlN or low Ga-content AlInGaN optical blocking layers in laser structures formed on nonpolar or semipolar substrates for improved laser diode characteristics. On their own, the optical blocking layers positioned below the active region can reduce waveguide leakage and/or increase the optical confinement in the quantum wells for higher gain. However, in most laser diode structures when the blocking layer becomes close enough to active region to increase the confinement in the quantum well, it will also increase the optical confinement in the p-type cladding, which will increase the loss. This is a result of the optical blocking layer "pushing" the mode upward, which both increases the overlap in the quantum wells and in the lossy p-cladding above the quantum wells. Therefore, there is a gain versus loss trade-off when using the optical blocking layer to modify the optical confinement in the quantum wells layer(s) in conventional laser diode structures, but may still be advantageous in some embodiments such as to reduce the parasitic waveguide leakage or achieve more benefit from the increase in gain than detriment from the increase in p-cladding loss. When this blocking layer is combined with the high indium content or thick InGaN layer guiding concept, the optical gain can be increased, the p-type cladding loss can be reduced, and the waveguide leakage can be reduced simultaneously. In such a structure, the high indium content and/or thick InGaN layer positioned below the quantum wells effectively "pulls" the mode downward toward the high indium content InGaN layer to reduce the overlap with the p-type cladding. By positioning an optical blocking layer below the high indium content InGaN layer, the mode will be "pushed" back upward toward the quantum wells, but not substantially into the p-cladding region because the high indium content InGaN layer continues to "pull" downward. An example of the high indium content or thick InGaN can be found in U.S. Provisional Application No. 61/410,794 filed Nov. 5, 2010, commonly assigned, and hereby incorporated by reference herein.

In a preferred embodiment, the present invention provides a method and device structure using an optical blocking region with no AlGaN or InAlGaN cladding regions. In a preferred embodiment, the present method and device is substantially free from any cladding regions and/or layers and/or optical blockers above the active region, e.g., MQW. In some variations, the present method and device structure can include n-type layers such as silicon doped GaN layers positioned between the GaN substrate and the optical blocking region and/or can include n-type layers such as silicon doped GaN layers positioned between the optical blocking region and the SCH region. In other embodiments, the present method and device structure can also include other GaN cladding regions free from aluminum bearing species, which are detrimental to device structure and/or performance.

In a specific embodiment, the present invention provides an optical device, e.g., laser diode. The device includes a gallium and nitrogen containing substrate comprising a surface region, e.g., semipolar, nonpolar. The device could have an n-type region such as Si-doped GaN overlying the surface region. The device has an optical blocking region comprising InAlN overlying the surface region. The InAlN is preferably n-type and could be substantially lattice matched. The device has an n-type region such as Si-doped GaN overlying the surface region. The device has a strained region overlying the surface region and a strain control region, which is configured to maintain at least a quantum well region within a predetermined strain state. The device has an optical confinement region overlying the strain control region and a plurality of quantum well regions overlying the optical confinement region. The device may also have an upper optical guiding layer overlying the plurality of quantum well regions. The device has a p-type cladding region overlying the plurality of quantum well regions. Preferably, the strain control region has a higher bandgap than the strained region and the quantum well layers.

In an alternative specific embodiment, the present invention provides an optical device. The optical device includes a gallium and nitrogen containing substrate comprising a surface region and could have an n-type region such as Si doped GaN overlying the surface region. The optical device has an n-type optical blocking region overlying the surface region. Preferably, the optical blocking region comprises n-type InAlN material, which could be substantially lattice matched. The device has a strain control region, which is configured to maintain a quantum well region within a predetermined strain state and a plurality of quantum well regions overlying the strain control region. In a preferred embodiment, the strained region is a strained separate confined heterostructure (SCH).

In an alternative implementation the device has a nitrogen and gallium containing material having a surface region and an n-type GaN material overlying the surface region. The device has a substantially latticed matched n-type InAlN material configured as an optical blocking region overlying the n-type GaN material. The device has an n-type material such as Si-doped GaN and a high indium content and/or thick InGaN region overlying the lattice matched InAlN material in a specific embodiment. The device has an active region overlying the high indium content or thick InGaN region and a p-type region overlying the active region.

In another embodiment, the device has a gallium and nitrogen containing material having a surface region, which is configured in a semipolar or nonpolar orientation. The device has an optical blocking region overlying the surface region and an active region overlying the optical blocking region. The device also has a p-type region overlying the active region.

Alternatively, the device has a gallium and nitrogen containing material having a surface region, which is configured in a semipolar or nonpolar orientation. The device also has an optical blocking region overlying the surface region, a n-type region such as Si doped GaN overlying the optical blocking region, and a high indium content SCH region overlying the optical blocking region. The device has an active region overlying the optical blocking region and a p-type region overlying the active region.

In a specific embodiment, the optical blocking region is a spatial region of lower refractive index than surrounding cladding materials. Examples of cladding materials in conventional GaN based laser diodes fabricated on c-plane would be comprised of AlGaN or InAlGaN, but in the present method and structures the cladding materials are comprised of GaN. Due to the large refractive index contrast between the effective index of the guided mode and the refractive index of optical blocking region, the optical blocking region functions to prevent light from leaking from the guided mode into the substrate. Further, with careful design the optical blocking region can be used to manipulate the position of the guided mode relative to the active region and other surrounding layers such as the p-type region.

We have discovered that on nonpolar and semipolar substrates more and/or thicker quantum wells can be grown as compared to conventional c-plane growth structures. Therefore, it is possible to achieve sufficient optical confinement in the quantum wells for high efficiency laser diode without the use of AlGaN or InAlGaN cladding layers. However, without the use of these cladding layers, waveguide structures are still likely to suffer from parasitic leakage of the optical mode into the substrate. This parasitic leakage results in increased optical loss from the laser cavity and beam anomalies.

By placing a very low refractive index optical blocking layer below the active region, this optical leakage can be prevented. Accordingly, the present method and devices are configured on nonpolar and semipolar laser structures without the use of conventional AlGaN or InAlGaN cladding regions. Thus in the present structure, it is believed to prevent parasitic leakage from the optical mode into the substrate without the use of conventional cladding regions, which are detrimental.

Examples of limitations of conventional cladding regions are described below:

1. Long growth associated with these Al-containing clad layers reduces throughput.

2. Al-containing clad layers very close to the active region where the optical intensity is the highest is known to create limitations including catastrophic facet damage at higher powers.

3. Al-containing clad layers on the p-side of the active region makes it more difficult to achieve low voltage operation.

4. Al-containing clad layers are known to reduce yields and reliability.

As used herein in examples, the terms "high indium content and/or thick InGaN layer(s) or regions" generally refers to an InGaN or like material capable of manipulating an optical mode or modes within a design of a laser diode. As an example, such InGaN region or layers are characterized by a thickness range and an indium concentration range that leads to excessive cumulative strain within the growth structures and hence certain material degradation such as defects in the growth structures without the present strain control region(s) or layer(s). That is, if there were no strain control region, such InGaN layers would be detrimentally strained and lead to poor or undesirable material characteristics such as photoluminescence, electroluminescence, and optical device efficiency due certain defect characteristic in the structure that would be present at the interface between the high indium content and/or thick InGaN region and the underlying layer, and/or in the multi-quantum well region, and/or in other regions. It should be noted that the InGaN layer(s) in its final form may be partially relaxed due to the presence of defects and/or the strain control region, although it would be strained without such defects and/or stain control region. As an example, such cumulative strain often is a function of a combination of indium concentration and total thickness. For lower indium content layers, much thicker layers are grown before cumulative strain degradation occurs, while higher indium content may result in thinner layers before cumulative strain degradation occurs. Also, a higher number of quantum wells may lead to higher cumulative stain than fewer quantum wells.

In a specific embodiment, the present InGaN region can be configured with a suitable thickness and indium content for a laser diode device. Such InGaN region includes a thickness range from about 30 to about 80 nm and about 8 to about 16% indium content. Alternatively, the InGaN region includes a thickness range from about 70 to about 150 nm and about 8 to about 13% indium content. Alternatively, the InGaN region includes a thickness ranging from about 140 to about 300 nm and about 5 to about 9% indium content. Alternatively, the InGaN region includes a thickness ranging from about 250 to about 500 nm and about 3 to about 6% indium content. Alternatively, the InGaN region includes a thickness ranging from about 10 nm to about 30 nm and about 15 to about 22% indium content.

As used herein as an example, an SCH or optical confinement regions includes an InGaN or other indium containing layer(s) that possess higher refractive index than the cladding regions and yield acceptable defect levels and material quality when incorporated in a device structure containing a multiple quantum well active region on non-polar or semi-polar Ga containing substrates such as {20-21}. Examples of SCH regions are InGaN layers with a thickness range from about 30 to about 80 nm and about 4 to about 9% indium content, or a thickness range from about 70 to about 150 nm and about 3 to about 6% indium content, or a thickness ranging from about 140 to about 300 nm and about 2 to about 4% indium content, or a thickness ranging from about 250 to about 500 nm and about 1 to about 3% indium content.

As used herein the term Super SCH includes an InGaN or other indium containing layer(s) that yield heavily defected material and hence poor device properties due to excessive strain when incorporated in a device structure and not combined with strain control region(s) on nonpolar or semipolar Ga-containing substrates such as {20-21}. Once the Super SCH has been integrated with the strain control region(s) acceptable, desirable, and even improved device performance occurs, as will be described throughout the present specification and more particularly below. Examples of such Super SCH regions are InGaN layers with a thickness range from about 30 to about 80 nm and about 8 to about 16% indium content, or a thickness range from about 70 to about 150 nm and about 8 to about 13% indium content, or a thickness ranging from about 140 to about 300 nm and about 5 to about 9% indium content, or a thickness ranging from about 250 to about 500 nm and about 3 to about 6% indium content, or a thickness ranging from about 10 nm to about 30 nm and about 15 to about 22% indium content.

The present invention enables a cost-effective optical device for laser applications. In a specific embodiment, the optical device can be manufactured in a cost effective manner. The present laser device uses a semipolar gallium nitride material capable of achieve a green laser device, among others. In other embodiments, the laser device is capable of emitting long wavelengths such as those ranging from about 480 nm to greater than about 540 nm, but can be others such as 540 nm to 660 nm. In one or more alternative embodiments, the laser device is capable of emitting blue wavelengths such as those ranging from about 420 nm to greater than about 480 nm, but can be others. In a preferred embodiment, the present method and structure can be used to control or engineer strain within the wave guiding layers and quantum well region of laser devices.

Although the above has been described in terms of a preferred optical blocking region made of AlInN, the present method and device can also include variations, alternatives, and modifications. As an example, the optical blocking region can be made using a low Ga content AlInGaN such as Al1−x−yInyGaxN where x is less than 10%, x is less than 20%, or x is less than 30%.

BRIEF DESCRIPTION OF THE DRAWINGS

FIG. 1 is a conventional laser device configured on a c-plane GaN material having an optical blocking region in combination with an AlGaN cladding region;

FIG. 2 is a diagram of a process flow for manufacturing an optical device;

FIG. 3 is a diagram of an alternative process flow for manufacturing an optical device;

FIG. 4 is a diagram of refractive index plotted against waveguide position for an optical device for a base line laser device;

FIG. 5 is a diagram of refractive index plotted against waveguide position for an optical device for a laser device;

FIG. 6 is a diagram of refractive index plotted against waveguide position for an alternative optical device for a laser device;

FIG. 7 is a diagram of refractive index plotted against waveguide position for an optical device for an HS-SCH base line laser device;

FIG. 8 is a diagram of refractive index plotted against waveguide position for an optical device for an HS-SCH laser device;

FIG. 9 is a diagram of refractive index plotted against waveguide position for an alternative optical device for an HS-SCH laser device;

FIG. 10 is a diagram of refractive index plotted against waveguide position for an alternative optical device for an HS-SCH laser device;

FIG. 11 illustrates a (1) reciprocal space map; and (2) optical image of AlInN configured on a (20-21) gallium and nitrogen containing surface region;

FIGS. 12(a) and 12(b) illustrate growth rate and morphology for an optical blocking region;

FIG. 13 is an illustration of voltage plotted against current;

FIG. 14 is a perspective view of a laser device fabricated on a {20-21} plane or an off-cut of {20-21};

FIG. 15A is a detailed cross-sectional view of a laser device fabricated on a {20-21} substrate;

FIG. 15B is a detailed cross-sectional view of a laser device fabricated on a {20-21};

FIG. 16 is a perspective view of a laser device fabricated on a non-polar oriented gallium and nitrogen containing substrate;

FIG. 17 is a detailed cross-sectional view of a laser device fabricated on a non-polar oriented gallium and nitrogen substrate;

FIG. 18 illustrates interference images of (1) a laser device without optical blocking region; (2) a laser device with optical block region; and FIG. 19 illustrates light leakage images of (1) a laser device without optical blocking region; (2) a laser device with optical block region.

DETAILED DESCRIPTION OF THE INVENTION

The present invention provides a method and device for emitting electromagnetic radiation using nonpolar or semipolar gallium containing substrates such as GaN, AN, InN, InGaN, AlGaN, and AlInGaN. More particularly, the present invention provides a method and device using a gallium and nitrogen containing substrate configured on the {20-21} family of planes or an off-cut of the {20-21} family of planes towards the plus or minus c-plane and/or towards the a-plane according to one or more embodiments, but there can be other configurations. Additionally, the present invention provides a method and device using a gallium and nitrogen containing substrate configured on the m-plane family of planes or an off-cut of the m-plane family of planes towards the plus or minus c-plane and/or towards the a-plane. Still more particularly, the present invention provides a method and resulting structures that use an optical blocking region configured to provide desired optical properties in devices such as laser diodes.

FIG. 1 is a conventional laser device configured on a c-plane GaN material having an optical blocking region in combination with an AlGaN cladding region. As shown, the conventional c-plan GaN device is characterized by interference effects in farfield pattern from a leaky mode in the laser structure that is without the optical blocking region. As shown, the laser structure also includes AlGaN cladding regions. Further details of the device can be found in A. Castiglia, J.-F. Carlin, E. Feltin, G. Cosendey, J. Dorsaz, and N. Grandjean, "Emission characteristics of GaN-based blue lasers including a lattice matched Al0.83In0.17N optical blocking layer for improved optical beam quality," APL 97, 111104 2010, which is hereby incorporated by reference.

A method according to a specific embodiment can be summarized as follows in reference to FIG. 2:

Provide gallium and nitrogen containing substrate configured in a non-polar or semipolar orientation;

Transfer the substrate into a reaction chamber;

Deposit n-type cladding region using an MOCVD growth process;

Deposit substantially lattice matched n-type AlInN or low gallium content InAlGaN region configured as an optical blocking region;

Deposit n-type cladding region;

Deposit SCH region;

Form MQW regions;

Deposit electron blocking region;

Deposit p-type cladding region;

Deposit p-type contact region;

Remove substrate from chamber; and

Perform other steps, as desired.

FIG. 2 is a diagram of a process flow for manufacturing an optical device according to an embodiment of the present invention.

An alternative method according to a specific embodiment can be summarized as follows in reference to FIG. 3:

Provide gallium and nitrogen containing substrate configured in a non-polar or semipolar orientation;

Transfer the substrate into a reaction chamber;

Deposit n-type cladding region using an MOCVD growth process;

Deposit substantially lattice matched n-type AlInN or low gallium content InAlGaN region configured as an optical blocking region;

Remove substrate from reaction chamber;

Transfer substrate into another reaction chamber or the same reaction chamber for regrowth;

Deposit n-type cladding region;

Deposit SCH region;

Form MQW regions;

Deposit electron blocking region;

Deposit p-type cladding region;

Deposit p-type contact region;

Remove substrate from chamber; and

Perform other steps, as desired.

Depending upon the embodiment, the method provides the above sequence of steps to form an optical device having an optical blocking region. Some steps may be combined, others separated, one or more steps may be inserted, and or replaced, or the like.

FIG. 3 is a diagram of an alternative process flow for manufacturing an optical device according to an embodiment of the present invention.

As will be shown, the following simulations incorporate InAlN blocking layers to present green LD active regions and into present waveguide designs that make use of high indium content and/or thick InGaN layer strain control. As will be shown, we refer to the high indium content and/or thick InGaN layer as the high-strained SCH (HS-SCH). As used herein, the term "HS-SCH" means a highly strained SCH region. In the case of lattice matched InAlN on the c-plane, the approximate indium content is ~17%, but due to the different c/a ratios, the substantially lattice matched composition will be slightly different. Literature reports that the refractive index of substantially lattice-matched AlInN on c-plane is equivalent to the refractive index of AlGaN with 46% Al concentration. For the simulations in this work we used this approximation for the purpose of showing the effects of the blocking layers on the optical mode. However, as stated above, the refractive index will be slightly different based on the crystallographic orientation and on material parameters used in the calculation. In practice adjustments in thickness can be made to compensate any differences in the index of the optical blocking layer.

FIG. 4 is a diagram of refractive index plotted against waveguide position for a base line laser device. As shown, a vertical axis illustrates a refractive index plotted against a waveguide position for an improved laser diode device, which will be explained in more detail below. The device has a gallium and nitrogen containing substrate comprising a surface region in a specific embodiment. The substrate is preferably GaN or other suitable material. As also shown, the device includes an n-type cladding region which is overlying the substrate and an SCH region, which is overlying the n-type GaN. In a specific embodiment, the SCH region comprises InGaN and is n-type. Overlying the SCH region is a plurality of quantum well regions having an InGaN/GaN alternating structure. In a specific embodiment, the device also has an upper guide or SCH, which can be either GaN or InGaN. The device also has an electron blocking region, such as those made by AlGaN, AlInGaN or other suitable materials such as AlInN. In a specific embodiment, the device has an overlying p-type cladding region, such as GaN, which is doped.

As shown, the baseline design includes an optical confinement of 5% in the quantum wells. The design also includes an optical confinement of ~37% in the p-type GaN.

FIG. 5 is a diagram of refractive index plotted against waveguide position for an optical device for a base line laser device. As shown, the present device includes an InAlN region or optical blocking region below the n-type SCH region. In a specific embodiment, the InAlN is separated with ~700 nm of n-type GaN below the SCH. The device also includes 300 nm of substantially lattice matched InAlN below n-type GaN. As shown, the device achieved no change in modal gain, no change in modal loss associated with p-type GaN, and reduced loss from less parasitic mode leakage into the n-type GaN and GaN substrate.

FIG. 6 is a simplified diagram of refractive index plotted against waveguide position for an alternative optical device for a base line laser device. As shown, the present device includes an InAlN region or optical blocking region below the n-type SCH region. In a specific embodiment, the InAlN is separated with ~300 nm of n-type GaN below the SCH. The device also includes 300 nm of substantially lattice matched InAlN below nGaN. As shown, the device achieved a 10% increase in modal gain, 13% increase in modal loss associated with pGaN, and reduced loss from less parasitic mode leakage into nGaN.

In the following embodiments, the present device configured with the optical blocking region is integrated with green laser diode devices in a specific embodiment. As an example, the optical device is emits green electromagnetic radiation (e.g., 520 nm), among other wavelengths. In a specific embodiment including optical blocking regions, the present method and structure includes a high indium content and/or thick InGaN layers in the present epitaxial structures grown on {20-21} and offcuts thereof in gallium and nitrogen containing substrates. In a preferred embodiment, the high indium content and/or thick InGaN layers include 200-300 nm InGaN layers with 6% indium, 100 nm InGaN layers with 10% indium, 60 nm InGaN layers with 10-15% indium, or 30 nm InGaN layers with 15-18% indium within the present green laser diode epitaxial structure without detriment to photoluminescence properties, electroluminescence properties, or defect density of the light emitting multiple quantum well active region. In a specific embodiment, the present green laser diode epitaxial structure includes an optical blocking region, n-side separate confinement hetereostructure (SCH), a multiple quantum well active region (MQW), a p-side SCH or GaN guiding layer, and electron blocking layer, and a p-type GaN cladding region. However, with the inclusion of the high indium content and/or thick InGaN layer, not all of these layers would be provided in a preferred epitaxial structure. For example, the n-side SCH layer can be removed such that the high indium content and/or thick InGaN layer would be used to modify the optical confinement properties of the mode and hence would act as an SCH region without the SCH region and therefore a "Super-SCH" region. In other embodiments, the combination of an SCH and high indium content and/or thick InGaN layers are included.

In a preferred embodiment, the method and structure includes use of a combination of the high indium content and/or thick InGaN layers with a strain control region and optical blocking region. As an example in such embodiments, in order to include these high indium content and/or thick InGaN layers that act as the "super-SCH", one preferably includes the strain control region. That is, the strain control region exists spatially between the high indium content and/or thick InGaN layers and the MQW. The strain control region performs some sort of strain compensation function and ultimately suppresses the defect density at the interface between the high indium content and/or thick InGaN layer and the underlying layer(s), in the multiple quantum well region, or in other regions, as will be further explained and described below. It also limits the defect density within the MQW in a specific embodiment. The strain control region is generally composed of a material with higher bandgap than both the high indium content and/or thick InGaN layer and the quantum well layers. The strain control region is preferably 5 nm to 20 nm or 20 nm to 50 nm and comprised of GaN, AlGaN, or InAlGaN and can be doped.

As an example, the present method and structures lead to improved optical device performance, as describe below. In a specific embodiment, the present method and structure includes a high indium content and/or thick InGaN region and optical blocking region within an optical device.

In a specific embodiment, the present laser device can be employed in either a semipolar or nonpolar gallium containing substrate, as described below. As used herein, the term "substrate" can mean the bulk substrate or can include overlying growth structures such as a gallium and nitrogen containing epitaxial region, or functional regions such as n-type GaN, combinations, and the like. We have also explored epitaxial growth and cleave properties on semipolar crystal planes oriented between the nonpolar m-plane and the polar c-plane. In particular, we have grown on the {30-31} {30-3-1}, and {20-21} families of crystal planes. We have achieved promising epitaxy structures and cleaves that will create a path to efficient laser diodes operating at wavelengths from about 400 nm to green, e.g., 500 nm to 540 nm. These results include bright blue epitaxy in the 450 nm range, bright green epitaxy in the 520 nm range, and smooth cleave planes orthogonal to the projection of the c-direction. It is desirable to align the laser cavities parallel to the projection of the c-direction for maximum gain on this family of crystal planes.

Although it was believed that a higher gain would be offered in the projection of the c-direction than would be available in the a-direction, it is also desirable to form a high quality cleavage plane orthogonal to a stripe oriented in the projection of the c-direction. More specifically, we desired a high quality cleavage plane orthogonal to the [10-1-7] for a laser stripe formed on the {20-21} plane. In one or more preferred embodiments, we determined a high quality cleave plane substantially orthogonal to the projection of the c-direction, [10-1-7]. In particular, we determined that if a top side skip-scribe scribing technique is used followed by a break step a high quality smooth and vertical cleaved facet would be formed on the upper portion of the cleave face according to one or more embodiments. Below the upper portion of the cleave face the facet becomes angled, which may not be optimum for a laser diode mirror according to one or more embodiments. In other embodiments, however, such angled cleave characteristic is desirable for laser fabrication since the laser mirror will be positioned on top of the substrate where the cleave face is vertical. In one or more embodiments, when the sample is back side laser scribed and then broken, an angled, but smooth cleave face is formed. Such a smooth cleave face may be desirable for lasers, but it is not the most preferable since the laser mirror will be tilted. The top-side skip scribe technique looks more preferably according to one or more embodiments.

FIG. 7 is a simplified diagram of refractive index plotted against waveguide position for an optical device for an HS-SCH base line laser device. As used herein, the term "HS-SCH" means a highly strained SCH region and refers to the high indium content and/or thick InGaN layers, which has been used herein. As shown, a vertical axis illustrates a refractive index plotted against a waveguide position for an improved laser diode device, which will be explained in more detail below. The device has a gallium and nitrogen containing substrate comprising a surface region in a specific embodiment. The substrate is preferably GaN or other suitable material. As also shown, the device includes an n-type SCH region, which is overlying the GaN. In a specific embodiment, the n-type SCH region comprises InGaN. Overlying the SCH are a plurality of quantum well regions having an InGaN/GaN alternating structure. In a specific embodiment, the device also has an upper guide or SCH, which can be either GaN or InGaN. The device also has an electron blocking region, such as those made by AlGaN, AlInGaN or other suitable materials such as AlInN. In a specific embodiment, the device has an overlying p-type cladding region, such as GaN, which is doped. As shown, the baseline design includes a 5.8% MQW confinement. The design also includes a p-type GaN confinement of 28%. As a result, this device achieves a 16% increase in modal gain and 26% decrease in modal loss associated with p-type GaN compared to the structure in FIG. 4.

FIG. 8 is a diagram of refractive index plotted against waveguide position for an optical device for an HS-SCH base line laser device. As shown, the present device includes an InAlN region or optical blocking region below the n-type HS-SCH region. In a specific embodiment, the InAlN is about 300 nm below the HS-SCH, separated by n-type GaN. The device also includes 300 nm of substantially lattice matched InAlN below nGaN. As shown, the device achieved a 20% increase in modal gain, 23% reduction in modal loss associated with p-type GaN, and reduced loss from less parasitic mode leakage into n-type GaN compared to the structure in FIG. 4.

FIG. 9 is a diagram of refractive index plotted against waveguide position for an alternative optical device for an HS-SCH base line laser device. As shown, the present device includes an InAlN region or optical blocking region below the n-type HS-SCH region. In a specific embodiment, the InAlN is about 150 nm below the HS-SCH, separated by n-type GaN. The device includes 300 nm of substantially lattice matched InAlN below n-type GaN. Preferably, the n-type SCH is removed from the base line design. As shown, the device achieved a 30% increase in modal gain, 10% reduction in modal loss associated with p-type GaN, and reduced loss from less parasitic mode leakage into n-type GaN compared to the structure in FIG. 4.

FIG. 10 is a diagram of refractive index plotted against waveguide position for an alternative optical device for an HS-SCH base line laser device. As shown, the present device includes an InAlN region or optical blocking region below the n-type HS-SCH region. In a specific embodiment, the InAlN is about 150 nm below the HS-SCH, separated by n-type GaN. The device also includes 300 nm of substantially lattice matched InAlN below nGaN. Preferably, the n-type SCH is removed from the base line design. As shown, the device achieved a 34% increase in modal gain, no change in modal loss associated with p-type GaN, and reduced loss from less parasitic mode leakage into n-type GaN compared to the structure in FIG. 4.

FIG. 11 illustrates a (1) reciprocal space map; and (2) optical image of AlInN configured on a {20-21} gallium and nitrogen containing surface region.

FIGS. 12(a) and 12(b) illustrate growth rate and morphology for an optical blocking region.

FIG. 13 is an illustration of voltage plotted against current according to an embodiment of the present invention.

FIG. 14 is a perspective view of a laser device 1400 fabricated on an off-cut m-plane {20-21} substrate according to an embodiment of the present invention. This diagram is merely an example, which should not unduly limit the scope of the claims herein. For example, this concept could be applied to m-plane. One of ordinary skill in the art would recognize other variations, modifications, and alternatives. As shown, the optical device includes a gallium nitride substrate member 1401 having the off-cut m-plane crystalline surface region, although it may also be free from any off-cut. In a specific embodiment, the gallium nitride substrate member is a bulk GaN substrate characterized by having a semipolar or nonpolar crystalline surface region, but can be others. In a specific embodiment, the bulk nitride GaN substrate comprises nitrogen and has a surface dislocation density between about 10E5 cm-2 and about 10E8 cm-2 or below 10E5 cm-2. The nitride crystal or wafer may comprise $Al_xIn_yGa_{1-x-y}N$, where $0 \leq x$, y, $x+y \leq 1$. In one specific embodiment, the nitride crystal comprises GaN. In one or more embodiments, the GaN substrate has threading dislocations, at a concentration between about 10E5 cm-2 and about 10E8 cm-2, in a direction that is substantially orthogonal or oblique with respect to the surface. As a consequence of the orthogonal or oblique orientation of the dislocations, the surface dislocation density is between about 10E5 cm-2 and about 10E7 cm-2 or below about 10E5 cm-2. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, commonly assigned, and hereby incorporated by reference herein.

In a specific embodiment on the {20-21} GaN, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser stripe region has a first end 1407 and a second end 1409. In a preferred embodiment, the device is formed on a projection of a c-direction on a {20-21} gallium and nitrogen containing substrate having a pair of cleaved mirror structures, which face each other. In a preferred embodiment, the first cleaved facet comprises a reflective coating and the second cleaved facet comprises a reflective coating, no coating, an antireflective coating, or exposes gallium and nitrogen containing material.

In a preferred embodiment, the device has a first cleaved facet provided on the first end of the laser stripe region and a second cleaved facet provided on the second end of the laser stripe region. In one or more embodiments, the first cleaved facet is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating or no coating.

In a specific embodiment, the laser stripe has a length and width. The length ranges from about 50 microns to about 3000 microns, but is preferably between 400 microns and 1000 microns. The stripe also has a width ranging from about 0.5 microns to about 50 microns, but is preferably between 0.8 microns and 3 microns, but can be other dimensions. In a specific embodiment, the present device has a width ranging from about 0.5 microns to about 1.5 microns, a width ranging from about 1.5 microns to about 3.0 microns, a width ranging from about 3.0 microns to about 15.0 microns, and others. In a specific embodiment, the width is substantially constant in dimension, although there may be slight variations. The width and length are often formed using a masking and etching process, which are commonly used in the art.

In a specific embodiment, the present invention provides an alternative device structure capable of emitting 501 nm and greater (e.g., 525 nm) light in a ridge laser embodiment. The device is provided with one or more of the following epitaxially grown elements, but is not limiting, and in reference to FIG. 15A:

an n-GaN cladding region with a thickness of 50 nm to about 6000 nm with a Si or oxygen doping level of about 5E16 cm-3 to 1E19 cm-3;

an optical blocking region of InAlN or low gallium content InAlGaN material with a thickness of 100 to 1000 nm with a Si or oxygen doping level of about 5E16 cm-3 to 1E20 cm-3;

an n-GaN cladding region with a thickness of 10 nm to about 2000 nm with a Si or oxygen doping level of about 5E16 cm-3 to 1E19 cm-3;

an InGaN region of a high indium content and/or thick InGaN layer(s) or Super SCH region;

a higher bandgap strain control region such as GaN overlying the InGaN region;

optionally, an SCH region overlying the higher bandgap region, which is overlying the InGaN region;

multiple quantum well active region layers comprised of three to five or four to seven 3.0-5.5 nm InGaN quantum wells separated by 1.5-5.0 nm GaN or InGaN barriers optionally, a p-side GaN guiding layer or SCH layer comprised of InGaN with an atomic fraction of indium of between 0% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 400 nm to 1000 nm with Mg doping level of 3E17 cm-3 to 5E19 cm-3 a p++-GaN contact layer with a thickness from 20 nm to 40 nm with Mg doping level of 1E20 cm-3 to 1E21 cm-3

In a specific embodiment, the laser device is fabricated on a {20-21} substrate.

FIG. 15A is a detailed cross-sectional view of a laser device fabricated on a {20-21} substrate according to an embodiment of the present invention. As shown, the laser device includes gallium nitride substrate 1502, which has an underlying n-type metal back contact region 1501. An n-type cladding region, 1503, is formed overlying the gallium nitride substrate. Overlying the gallium nitride substrate and n-type cladding region is a high indium content and/or thick InGaN layer 1506. In a specific embodiment, the device has a strain control layer 1507 overlying the high indium content and/or thick InGaN layer. In a specific embodiment, the metal back contact region is made of a suitable material such as those noted below and others.

In a specific embodiment, the device also has an optical blocking region 1504, an overlying n-type gallium nitride layer 1505, an n-type cladding layer, a high indium content and/or thick InGaN layer 1506, a strain control layer 1507, optionally an SCH layer 1508, an active region 1509, and an overlying p-type gallium nitride layer structured as a laser stripe region 1511. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about 1E16 cm-3 and 1E20 cm-3.

In a specific embodiment, an n-type GaN material is deposited on the substrate. In a specific embodiment, the carrier concentration may lie in the range between about 1E16 cm-3 and 1E20 cm-3. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 15000. A flow of disilane in a carrier gas, with a total flow rate of between about 0.1 and 10 sccm, is initiated.

In a specific embodiment, the high indium content and/or thick InGaN layer(s) or regions comprises an InGaN or like material capable of manipulating an optical mode or modes within a design of a laser diode. As an example, such InGaN region or layers are characterized by a thickness range and an indium concentration range that leads to excessive cumulative strain within the growth structures and hence certain material degradation in the growth structures without the present strain control region(s) or layer(s). That is, if there were no strain control region, such InGaN layers would be detrimentally strained and lead to poor or undesirable material characteristics such as photoluminescence, electroluminescence, and optical device efficiency resulting from certain defect characteristics in the structure that could be located in the multi-quantum well region, and/or at the interface between the high indium content and/or thick InGaN region and the underlying layer, and/or in other regions. As an example, such cumulative strain often is a function of a combination of indium concentration and total thickness. For lower indium content layers, much thicker layers are grown before cumulative strain degradation occurs, while higher indium content may result in thinner layers before cumulative strain degradation occurs. Also, a higher number of quantum wells may lead to higher cumulative stain than fewer quantum wells.

In a specific embodiment, the present InGaN region can be configured with a suitable thickness and indium content for a laser diode device. Such InGaN region includes a thickness range from about 30 to about 80 nm and about 8 to about 16% indium content. Alternatively, the InGaN region includes a thickness range from about 70 to about 150 nm and about 8 to about 12% indium content. Alternatively, the InGaN region includes a thickness ranging from about 140 to about 300 nm and about 5 to about 9% indium content. Alternatively, the InGaN region includes a thickness ranging from about 250 to about 500 nm and about 3 to about 6% indium content. Alternatively, the InGaN region includes a thickness ranging from about 10 nm to about 30 nm and about 15 to about 22% indium content.

In a specific embodiment, the strain control layer(s) or regions, which also serves as a compensation region, comprises a higher band gap material, which has a band gap higher than a lower band gap material within a vicinity of the higher band gap material. As an example, the lower band gap material includes both the high indium or thick InGaN regions and the quantum well regions. In a specific embodiment, the higher bandgap material is comprised of GaN, AlGaN, or InAlGaN. In a specific embodiment, the laser stripe region is made of the p-type gallium nitride layer 1511. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region 1510, which exposes 1512 contact region. In a specific embodiment, the dielectric region is an oxide such as silicon dioxide or silicon nitride, but can be others. The contact region is coupled to an overlying metal layer 1513. The overlying metal layer is a multilayered structure containing gold and platinum (Pt/Au) or nickel and gold (Ni/Au).

In a specific embodiment, the laser device has active region 1509. The active region can include one to twenty quantum well regions according to one or more embodiments. As an example following deposition of the n-type $Al_u In_v Ga_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_w In_x Ga_{1-w-x}N$ and $Al_y In_z Ga_{1-y-z}N$, respectively, where $0 \leq w$, $x$, $y$, $z$, $w+x$, $y+z \leq 1$, where $w<u$, $y$ and/or $x>v$, $z$ so that the bandgap of the well layer(s) is less than that of the barrier layer(s) and the n-type layer. The well layers and barrier layers may each have a thickness between about 1.5 nm and about 12 nm. In another embodiment, the active layer comprises a double heterostructure, with an InGaN or AlwInxGa1-w-xN layer about 10 nm to 100 nm thick surrounded by GaN or AlyInzGa1-y-zN layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise AlsIntGa1-s-tN, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. In another embodiment the electron blocking layer comprises InAlGaN. In yet another embodiment there is no electron blocking layer.

As noted, the p-type gallium nitride structure is deposited above the electron blocking layer and active layer(s). The p-type layer may be doped with Mg, to a level between about 10E16 cm-3 and 10E22 cm-3, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region 1510, which exposes 1512 contact region. In a specific embodiment, the dielectric region is an oxide such as silicon dioxide, but other materials can be used.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Further details of the cleaved facets can be found throughout the present specification and more particularly below.

In a specific embodiment, the present invention provides an alternative device structure capable of emitting 501 nm and greater (e.g., 525 nm) light in a ridge laser embodiment. The device is provided with one or more of the following epitaxially grown elements, but is not limiting, and in reference to FIG. 15B:

- an n-GaN cladding region with a thickness of 50 nm to about 6000 nm with a Si or oxygen doping level of about 5E16 cm-3 to 1E19 cm-3;
- an optical blocking region of InAlN or low gallium content InAlGaN material with a thickness of 100 to 1000 nm with a Si or oxygen doping level of about 5E16 cm-3 to 1E20 cm-3;
- an n-GaN cladding region with a thickness of 10 nm to about 2000 nm with a Si or oxygen doping level of about 5E16 cm-3 to 1E19 cm-3;
- an SCH region;
  - a higher bandgap strain control region such as GaN overlying the InGaN region;
- multiple quantum well active region layers comprised of three to five or four to seven 3.0-5.5 nm InGaN quantum wells separated by 1.5-5.0 nm GaN or InGaN barriers
- optionally, a p-side GaN guiding layer or SCH layer comprised of InGaN with molar a fraction of indium of between 0% and 10% and a thickness from 15 nm to 100 nm
- an electron blocking layer comprised of AlGaN with molar fraction of aluminum of between 5% and 20% and thickness from 10 nm to 15 nm and doped with Mg.
- a p-GaN cladding layer with a thickness from 400 nm to 1000 nm with Mg doping level of 5E17 cm-3 to 1E19 cm-3
- a p++-GaN contact layer with a thickness from 20 nm to 40 nm with Mg doping level of 1E20 cm-3 to 1E21 cm-3

In a specific embodiment, the present invention provides an alternative device structure capable of emitting 501 nm and greater (e.g., 525 nm) light in a ridge laser embodiment.

FIG. 15B is a detailed cross-sectional view of a laser device fabricated on a {20-21} substrate according to an embodiment of the present invention.

As shown, the laser device includes gallium nitride substrate 1502, which has an underlying n-type metal back contact region 1501. An n-type cladding region, 1503, is formed overlying the gallium nitride substrate. Overlying the gallium nitride substrate and n-type cladding region is a high indium content and/or thick InGaN layer 1506. In a specific embodiment, the device has a strain control layer 1507 overlying the high indium content and/or thick InGaN layer.

In a specific embodiment, the device also has an optical blocking region 1504, an overlying n-type gallium nitride layer 1505, an n-type cladding layer, a high indium content and/or thick InGaN layer 1506, a strain control layer 1507, optionally an SCH layer 1508, an active region 1509, and an overlying p-type gallium nitride layer structured as a laser stripe region 1511. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about 1E16 cm-3 and 1E20 cm-3.

In a specific embodiment, an n-type GaN material is deposited on the substrate. In a specific embodiment, the carrier concentration may lie in the range between about 1E16 cm-3 and 1E20 cm-3. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 15000. A flow of disilane in a carrier gas, with a total flow rate of between about 0.1 and 10 sccm, is initiated.

In a specific embodiment, the high indium content and/or thick InGaN layer(s) or regions comprises an InGaN or like material capable of manipulating an optical mode or modes within a design of a laser diode. As an example, such InGaN region or layers are characterized by a thickness range and an indium concentration range that leads to excessive cumulative strain within the growth structures and hence certain material degradation in the growth structures without the present strain control region(s) or layer(s). That is, if there were no strain control region, such InGaN layers would be detrimentally strained and lead to poor or undesirable material characteristics such as photoluminescence, electroluminescence, and optical device efficiency resulting from certain defect characteristics in the structure that could be located in the multi-quantum well region, and/or at the interface between the high indium content and/or thick InGaN region and the underlying layer, and/or in other regions. As an example, such cumulative strain often is a function of a combination of indium concentration and total thickness. For lower indium content layers, much thicker layers are grown before cumulative strain degradation occurs, while higher indium content may result in thinner layers before cumulative strain degradation occurs. Also, a higher number of quantum wells may lead to higher cumulative stain than fewer quantum wells.

In a specific embodiment, the present InGaN region can be configured with a suitable thickness and indium content for a laser diode device. Such InGaN region includes a thickness range from about 30 to about 80 nm and about 8 to about 16% indium content. Alternatively, the InGaN region includes a thickness range from about 70 to about 150 nm and about 8 to about 12% indium content. Alternatively, the InGaN region includes a thickness ranging from about 140 to about 300 nm and about 5 to about 9% indium content. Alternatively, the InGaN region includes a thickness ranging from about 250 to about 500 nm and about 3 to about 6% indium content. Alternatively, the InGaN region includes a thickness ranging from about 10 nm to about 30 nm and about 15 to about 22% indium content.

In a specific embodiment, the strain control layer(s) or regions, which also serves as a compensation region, comprises a higher band gap material, which has a band gap higher than a lower band gap material within a vicinity of the higher band gap material. As an example, the lower band gap material includes both the high indium or thick InGaN regions and the quantum well regions. In a specific embodiment, the higher bandgap material is comprised of GaN, AlGaN, or InAlGaN. In a specific embodiment, the laser stripe region is made of the p-type gallium nitride layer 1511. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region 1510, which exposes 1512 contact region. In a specific embodiment, the dielectric region is an oxide such as silicon dioxide or silicon nitride, but can be others. The contact region is coupled to an overlying metal layer 1513. The overlying metal layer is a multilayered structure containing gold and platinum (Pt/Au) or nickel and gold (Ni/Au).

In a specific embodiment, the laser device has active region 1509. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN or InGaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where $w<u$, y and/or $x>v$, z so that the bandgap of the well layer(s) is less than that of the barrier layer(s) and the n-type layer. The well layers and barrier layers may each have a thickness between about 1.5 nm and about 12 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where $w<u$, y and/or $x>v$, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. In another embodiment the electron blocking layer comprises InAlGaN. In yet another embodiment there is net no electron blocking layer.

As noted, the p-type gallium nitride structure is deposited above the electron blocking layer and active layer(s). The p-type layer may be doped with Mg, to a level between about 10E16 cm-3 and 10E22 cm-3, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region 1510, which exposes 1512 contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

FIG. 16 is a detailed perspective view of a laser device 1600 fabricated on a non-polar oriented gallium and nitrogen containing substrate according to an embodiment of the present invention. As shown, the optical device includes a gallium nitride substrate member 1601 having a nonpolar crystalline surface region characterized by an orientation of about −2 degrees to about 2 degrees towards (0001) and less than about 0.5 degrees towards (11-20). In a specific embodiment, the gallium nitride substrate member is a bulk GaN substrate characterized by having a nonpolar crystalline surface region, but can be others. In a specific embodiment, the bulk GaN substrate has a surface dislocation density below 105 cm-2 or 10E5 to 10E7 cm-2. It should be noted that homoepitaxial growth on bulk GaN is generally better than hetero-epitaxy growth. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about 105 cm-2 and about 108 cm-2, in a direction that is substantially orthogonal or oblique with respect to the surface. As a consequence of the orthogonal or oblique orientation of the dislocations, the surface dislocation density is below about 105 cm-2 or others such as those ranging from about 10E5-10E8 cm-2.

In a specific embodiment, the device has a laser stripe region formed overlying a portion of the nonpolar crystalline orientation surface region. In a specific embodiment, the laser stripe region is characterized by a cavity orientation is substantially parallel to the c-direction. In a specific embodiment, the laser stripe region has a first end 1607 and a second end 1609.

In a preferred embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. In a specific embodiment, deposition of the reflective coating occurs using, for example, electron beam (ebeam) evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed cleaved surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating.

Also in a preferred embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, titania, tantalum pentoxide, zirconia, combinations, and the like. In a specific embodiment, the second mirror surface comprises an anti-reflective coating. In a specific embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed cleaved surface prior to coating.

In a specific embodiment, the laser stripe has a length and width. The length ranges from about 50 microns to about 3000 microns. The stripe also has a width ranging from about 0.5 microns to about 50 microns, but can be other dimensions. In a specific embodiment, the stripe can also be about 1 to 20 microns or 1 to 2 microns for a single lateral mode laser device. In a specific embodiment, the width is substantially constant in dimension, although there may be slight variations. The width and length are often formed using a masking and etching process, which are commonly used in the art.

In a specific embodiment, the device is also characterized by a spontaneously emitted light is polarized in substantially perpendicular to the c-direction. That is, the device performs as a laser or the like. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 400 nanometers to yield a violet emission, a blue emission, a green emission, and others. In other embodiments, the wavelength range is within about 405 nm or slightly more or less. In one or more embodiments, the light can be emissions ranging from violet 395 to 420 nanometers; blue 430 to 470 nm; green 500 to 540 nm; and others, which may slightly vary depending upon the application. In a preferred embodiment, the spontaneously emitted light is in the wavelength range of 430 nm and greater and is highly polarized with a polarization ratio of greater than 0.4. In a preferred embodiment, the spontaneous polarization ratio is greater than 0.3 for an emission polarized perpendicular to the c-direction for a spontaneous emission peak wavelength greater than 430 nm. In a specific embodiment, the emitted light is characterized by a polarization ratio that is desirable.

In a specific embodiment, the present invention provides an alternative device structure capable of emitting 400 nm and greater light in a ridge laser embodiment. The device is provided with one or more of the following epitaxially grown elements, and in reference to FIG. 17.

- an n-GaN cladding region with a thickness of 50 nm to about 6000 nm with a Si or oxygen doping level of about 5E16 cm-3 to 1E19 cm-3;
- an optical blocking region of InAlN or low gallium content InAlGaN material with a thickness of 50 to 1000 nm with a Si or oxygen doping level of about 5E16 cm-3 to 1E20 cm-3;
- an n-GaN cladding region with a thickness of 10 nm to about 2000 nm with a Si or oxygen doping level of about 5E16 cm-3 to 1E19 cm-3;
- an InGaN SCH region;
- a higher bandgap region such as GaN overlying the InGaN region;
- multiple quantum well active region layers comprised of three to five or five to eight 3.0-10.0 nm InGaN quantum wells separated by 1.5-10.0 nm GaN or InGaN barriers
- optionally, a p-side GaN guiding layer or SCH layer comprised of InGaN with molar a fraction of indium of between 0% and 10% and a thickness from 15 nm to 100 nm
- an electron blocking layer comprised of AlGaN with molar fraction of aluminum of between 5% and 20% and thickness from 10 nm to 15 nm and doped with Mg.

a p-GaN cladding layer with a thickness from 400 nm to 1000 nm with Mg doping level of 5E17 cm-3 to 1E19 cm-3 a p++-GaN contact layer with a thickness from 20 nm to 40 nm with Mg doping level of 1E20 cm-3 to 1E21 cm-3

In a specific embodiment, the present invention provides an alternative device structure capable of emitting blue and/or violet light in a ridge laser embodiment.

FIG. 17 is a detailed cross-sectional view of a laser device fabricated on a nonpolar substrate according to an embodiment of the present invention. As shown, the laser device includes gallium nitride substrate 1702, which has an underlying n-type metal back contact region 1701. In a specific embodiment, the metal back contact region is made of a suitable material such as those noted below and others.

In a specific embodiment, the device also has an overlying n-type gallium nitride layer 1703, an active region 1709, and an overlying p-type gallium nitride layer structured as a laser stripe region 1711. Additionally, the device also includes an n-side separate confinement hetereostructure (SCH) 1706. In a specific embodiment, the device also has a p++ type gallium nitride material 1712 to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about 10E19 to 10E21 Mg/centimeter3, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about 1016 cm-3 and 1020 cm-3.

In a specific embodiment, an n-type AluInvGa1−u−vN layer, where 0≤u, v, u+v≤1, is deposited on the substrate. In a specific embodiment, the carrier concentration may lie in the range between about 1016 cm-3 and 1020 cm-3. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In one specific embodiment, the susceptor is heated to approximately about 900 to about 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm is initiated.

In a specific embodiment, the laser stripe region is made of the p-type gallium nitride layer 1711. In a specific embodiment, the laser stripe is provided by an etching process selected from dry etching or wet etching. In a preferred embodiment, the etching process is dry, but can be others. As an example, the dry etching process is an inductively coupled plasma (ICP) process using chlorine bearing species or a reactive ion etching (RIE) process using similar chemistries or combination of ICP and RIE, among other techniques. Again as an example, the chlorine bearing species are commonly derived from chlorine gas or the like. The device also has an overlying dielectric region 1710, which exposes 1712 contact region, which is preferably a p++ gallium nitride region. In a specific embodiment, the dielectric region is an oxide such as silicon dioxide or silicon nitride, but can be others, such as those described in more detail throughout the present specification and more particularly below. The contact region is coupled to an overlying metal layer 1713. The overlying metal layer is a multilayered structure containing gold and platinum (Pt/Au) or nickel and gold (Ni/Au). In a specific embodiment, the Ni/Au is formed via electro-beam deposition, sputtering, or any like techniques. The thickness includes nickel material ranging in thickness from about 50 to about 100 nm and gold material ranging in thickness from about 1000 Angstroms to about 1-3 microns, and others.

In a preferred embodiment, the dielectric region can be made using a suitable technique. As an example, the technique may include reactively sputter of SiO2 using an undoped polysilicon target (99.999% purity) with 02 and Ar. In a specific embodiment, the technique uses RF magnetron sputter cathodes configured for static deposition; sputter target; throw distance; pressure: 1-5 mT or about 2.5 mT, power: 300 to 400 W; flows: 2-3.-9 sccm 02, 20-50 sccm, Ar, deposition thickness: 1000-2500 A, and may include other variations. In a specific embodiment, deposition may occur using non-absorbing, nonconductive films, e.g., Al2O3, Ta2O5, SiO2, Ta2O5, ZrO2, TiO2, HfO2, NbO2. Depending upon the embodiment, the dielectric region may be thinner, thicker, or the like. In other embodiments, the dielectric region can also include multilayer coatings, e.g., 1000A of SiO2 capped with 500 A of Al2O3. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like.

In a specific embodiment, the laser device has active region 1709. The active region can include one to twenty quantum well regions according to one or more embodiments. As an example following deposition of the n-type AluInvGa1−u−vN layer for a predetermined period of time, so as to achieve a predetermined thickness, an active layer is deposited. The active layer may comprise a single quantum well or a multiple quantum well, with 1-20 quantum wells. Preferably, the active layer may include about 3-7 quantum wells or more preferably 4-6 quantum wells or others. The quantum wells may comprise InGaN wells and GaN or InGaN barrier layers. In other embodiments, the well layers and barrier layers comprise AlwInxGa1−w−xN and AlyInzGa1−y−zN, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 40 nm. In a preferred embodiment, each of the thicknesses is preferably 1-8 nm. In a specific embodiment, each well region may have a thickness of about 4 nm to 6 nm and each barrier region may have a thickness of about 1 nm to about 5 nm, among others. In alternative specific embodiment, each well region may have a thickness of about 4 nm to 6 nm and each barrier region may have a thickness of about 1 nm to about 3 nm, among others. In alternative specific embodiment, each well region may have a thickness of about 4 nm to 8 nm and each barrier region may have a thickness of about 2 nm to about 8 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In a specific embodiment, the separate confinement heterostructure (SCH) can include AlInGaN or preferably InGaN, but can be other materials. The SCH is generally comprised of material with an intermediate index between the cladding layers and the active layers to improve confinement of the optical mode within the active region of the laser device according to a specific embodiment. In one or more embodiments, the SCH layers have a desirable thickness, impurity, and configuration above and below the active region to confine the optical mode. Depending upon the embodiment, the upper and lower SCH can be configured differently or the same. The electron blocking region can be on either side or both sides of the SCH positioned above the active region according to a specific embodiment. In a preferred embodiment, the lower SCH can range from about 10 nm to about 150 nm, and preferably about 40 to 120. The lower SCH is preferably InGaN having with about 2% to about 10% indium by atomic percent according to a specific embodiment. In a preferred embodiment the upper SCH region thickness ranges from about 10 to 150 nm, and preferably about 10 nm to 50 nm. The upper SCH is preferably GaN or InGaN having about 0% to about 5% indium by atomic percent according to a specific embodiment. In the case that that there is no indium in this upper layer, the layer can be referred to as an p-side guiding layer that is comprised of GaN.

In some embodiments, an electron blocking layer is preferably deposited. In a specific embodiment, the electron blocking layer comprises a gallium and nitrogen containing material including magnesium 10E16 cm-3 to about 10E22 cm-3. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN with an Al composition ranging from 10 to 20%. In another specific embodiment, the electron blocking layer comprises AlGaN with an Al composition ranging from 3 to 10%. In another embodiment, the electron blocking layer may not contain Al. In another embodiment, the electron blocking layer comprises an AlGaN/GaN super-lattice structure, comprising alternating layers of AlGaN and GaN, each with a thickness between about 0.2 nm and about 5 nm.

In some embodiments, there may not be an electron blocking layer. In a specific embodiment, the AlGaN blocking layer is replaced by a GaN layer doped with magnesium from about 10E16 cm-3 to about 10E22 cm-3.

In a specific embodiment, the present invention provides a laser device and related methods using thin barrier materials to achieve improved performance. In a specific embodiment for a nonpolar blue laser with multi-quantum well (MQW) active regions comprised of 4-7 QWs with thicknesses in the 4 to 6 nm range, barrier thicknesses in the 1.5 nm to 2.5 nm or 2.0 nm to 4.5 nm range provide the lowest threshold current, highest slope efficiency, and lower forward voltage. Blue laser diodes employing such MQW active regions with 3 or more, or 5 or more QWs fabricated on conventional c-plane GaN would be impractical due to the high strain accumulation, which would likely lead to the onset of defects.

By reducing the barrier thickness to the present ultra-thin 1.5 to 3.0 nm regime, the outer quantum wells within the active region are pushed in towards the peak of the optical mode. In other embodiments, the ultra-thin barrier can be 1.0 nm and less, although there can be some variations. In other embodiments, the ultra-thin barrier can be 3.0 nm and less, 2.5 nm and less, or 2.0 nm and less. This results in higher optical overlap of the electric field and the quantum wells within the laser. Since the modal gain of a laser is given by the product of the material gain and the optical confinement, this increase in the optical confinement results in increased modal gain. Increased gain reduces the threshold current density, and hence reduces the threshold current in a laser with a given cavity dimension.

Thin barriers can further increase the laser performance by again increasing the modal gain and by reducing absorption losses in the quantum wells by promoting a more uniform carrier distribution throughout the quantum wells according to a specific embodiment. The heavy effective mass of holes typically limits carrier transport in multi-quantum well InGaN-based devices. With a reduced total transport length from the p-side of the active region where holes are injected to the lower quantum wells towards the n-side, holes are more readily able to travel to the lowest quantum wells before recombining with an electron. Such thin barriers increase the probability for holes to tunnel through the barriers such that they do not need to overcome the potential energy of the hole/barrier hetereointerface. This again promotes more uniform carrier filling of the quantum wells. This more uniform carrier distribution profile assures that no wells are left unpumped such that they are absorbing or lossy to the optical mode. The higher loss associated with insufficiently pumped wells leads to an increased threshold current and a decreased slope efficiency. Further, the carrier uniformity prevents the case where a majority of the carriers are recombining in only some of the quantum wells such that the carrier concentration would become very high in those wells and the gain would saturate. A uniform carrier distribution guarantees that each quantum well is kept as far from gain saturation as possible for a given laser injection current.

A reduced transport length and a higher probability for carrier tunneling through the barriers could also reduce the forward voltage of the laser diode. Again, there can be other variations, modifications, and alternatives. As an alternative example for the present semipolar green laser operating in the 510 to 530 nm range, thin barriers can also be employed. In one embodiment for a green laser structure, 4 to 5 quantum wells with thicknesses that range from 3 nm to 4.5 nm and barriers that range in thickness from 2 nm to 4.5 nm can be employed. Again, there can be other variations, modifications, and alternatives.

As noted, the p-type gallium nitride structure, which can be a p-type doped $Al_qIn_rGa_{1-q-r}N$, where 0≤q, r, q+r≤1, layer is deposited above the active layer. The p-type layer may be doped with Mg, to a level between about 1016 cm-3 and 1022 cm-3, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region 1710, which exposes 1712 contact region. In a specific embodiment, the dielectric region is an oxide such as silicon dioxide, but can be others.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In a specific embodiment, a ridge waveguide is fabricated using a certain deposition, masking, and etching processes. In a specific embodiment, the mask is comprised of photoresist (PR) or dielectric or any combination of both and/or different types of them. The ridge mask is 1 to 2.5 microns wide for single lateral mode applications or 2.5 to 30 um wide for multimode applications. The ridge waveguide is etched by ion-coupled plasma (ICP), reactive ion etching (RIE), or other method. The etched surface is 5-250 nm above the active region. A dielectric passivation layer is then blanket deposited by any number of commonly used methods in the art, such as sputter, e-beam, PECVD, or other methods. This passivation layer can include SiO2, Si3N4, Ta2O5, or others. The thickness of this layer is 80-400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au. In a specific embodiment, the present laser device (e.g., 510 to 550 nm) achieves desirable wall plug efficiencies. That is, the wall-plug-efficiencies can be greater than 3%, greater than 5%, greater than 7% and greater than 10% at output powers of over 60 mW. In a specific embodiment, the present laser device (e.g., 430 to 480 nm) achieves desirable wall plug efficiencies. That is, the wall-plug-efficiencies can be greater than 12%, greater than 15%, greater than 18% and greater than 23% at output powers of over 60 mW.

Although AlInN is a preferred embodiment for optical blocking regions, there can be other variations, modifications, and alternatives. In a specific embodiment, the optical blocking region can include low Ga content InAlGaN as the optical blocker. In other embodiments, the low Ga content AlInGaN can be Al1−x−yInyGaxN where x is less than 10%, x is less than 20%, or x is less than 30%. Additionally, as used herein in the embodiments, the term "AlInN" and "InAN" have been are interchangeable or equivalent.

To prove the principles of the present examples, we have provided experimental results, which are provided in more detail below. These results have been achieved for an optical device having a nitrogen and gallium containing material having a surface region, which is a non-polar or semi-polar orientation. The device has an n-type GaN material overlying the surface region, a substantially latticed matched InAlN or a low gallium content InAlGaN material configured as an optical blocking region overlying the n-type GaN material, and a high indium content or thick InGaN region overlying the substantially lattice matched InAlN material or a low gallium content InAlGaN material. The device also has an active region overlying the high indium content or thick InGaN region and a p-type region overlying the active region.

FIG. 18 illustrates interference images of (1) a laser device without optical blocking region; (2) a laser device with optical block region according to an embodiment of the present invention. As shown, the image on the left hand side is a laser device fabricated on a gallium and nitrogen containing material with no optical blocking region. As shown, the image illustrates an undesirable amount of interference in the laser beam in both the far field image and an image of the beam captured using a CCD camera. As also shown, the image on the right hand side is a laser device fabricated on a gallium and nitrogen containing material with an optical block region according to an embodiment of the present invention. As shown, the image illustrates almost no interference in the laser beam in both the far field image and an image of the beam captured using a CCD camera.

FIG. 19 illustrates light leakage images of (1) a laser device without optical blocking region; (2) a laser device with optical block region according to an embodiment of the present invention. The laser device without the optical blocking region is characterized by leakage light in the 7-14% range. With the optical blocking region, the leakage light has been reduced significantly. That is, the laser device characterized by the 380 nm InAlGaN blocking layer with 700 nm nGaN spacer has leakage light of 0.7%. The laser device characterized by the 700 nm InAlGaN blocking layer with 700 nm nGaN spacer has leakage light of 0.03%. The reduction in leakage light is significant and has been achieved using the optical blocking region in combination with the present device structure using the GaN substrate. It should be noted that the dots of light are artifacts of test, which should be ignored. Also, the images were taken at 10 mW of output power for the laser devices. The substrate light %=integrated light in substrate divided by total integrated light. The noise level is at ~0.01%. Of course, there can be variations.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 and even non-standard packaging. In a specific embodiment, the present device can be implemented in a co-packaging configuration such as those described in U.S. Provisional Application No. 61/347,800, commonly assigned, and hereby incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27, 2010, which claims priority to U.S. Provisional Nos. 61/182,105 filed May 29, 2009 and 61/182,106 filed May 29, 2009, each of which is hereby incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Therefore, the above description and illustrations should not be taken as limiting the scope of the present invention which is defined by the appended claims.

What is claimed is:

1. An optical device comprising:
   a nitrogen and gallium containing substrate having a surface region, the surface region being in a non-polar or semi-polar orientation;
   an n-type GaN material overlying the surface region;
   an InAlN material or a low gallium content InAlGaN material where $In_yAl_{1-x-y}Ga_xN$ and x is less than about 30%, the InAlN material or the low gallium content InAlGaN material configured as an optical blocking region overlying the n-type GaN material, wherein the optical blocking region is substantially lattice matched with the nitrogen and gallium containing substrate;
   an n-type cladding region overlying the optical blocking region;
   a high indium content or thick InGaN region overlying the n-type cladding region, the optical blocking region having a lower refractive index than the n-type cladding region, and the high indium content or thick InGaN region having a higher refractive index than the n-type cladding region;
   an active region overlying the high indium content or thick InGaN region; and
   a p-type cladding region overlying the active region;
   wherein the optical device is free from AlGaN and InAlGaN cladding regions.

2. The device of claim 1 wherein the active region comprises 3 to 7 quantum well regions; whereupon the optical blocking region reduces leakage light of the substrate to less than about 1 percent.

3. The device of claim 1 wherein the optical blocking region is strained.

4. The device of claim 1 wherein the optical blocking region is n-type with a carrier concentration of 1E16 cm-3 to 1E20 cm-3.

5. The device of claim 1 wherein the optical blocking region has a thickness between 100 nm and 1500 nm.

6. The device of claim 1 wherein the optical blocking region is separated from the high indium content or thick InGaN region by about 200 nm to 1500 nm.

7. The device of claim 1 further comprising an electron blocking region of AlGaN material; and whereupon the optical device emits a laser beam having a wavelength between 435 nm and 540 nm.

8. The device of claim 1 wherein the optical blocking region is not exactly lattice matched with the nitrogen and gallium containing substrate.

9. The device of claim 1 wherein the lattice match between the optical blocking region and the nitrogen and gallium containing substrate varies based upon crystal orientation.

10. An optical device comprising:
    a gallium and nitrogen containing material having a surface region, the surface region being configured in a semi-polar or non-polar orientation;
    an optical blocking region overlying the surface region, the optical blocking region comprising an InAlN material or a low gallium content InAlGaN material where $In_yAl_{1-x-y}Ga_xN$ and x is less than about 30%;
    an n-type cladding region overlying the optical blocking region;
    an InGaN strained region overlying the n-type cladding region, the optical blocking region having a lower refractive index than the n-type cladding region, and the InGaN strained region having a higher refractive index than the n-type cladding region;
    an active region overlying the InGaN strained region; and
    a p-type cladding region overlying the active region;
    wherein the optical device is free from an AlGaN or InAlGaN cladding regions.

11. The device of claim 10 wherein the optical blocking region is substantially lattice matched with the gallium and nitrogen containing material.

12. The device of claim 10 wherein the optical blocking region is tensile strained.

13. The device of claim 10 wherein the optical blocking region is compressively strained.

14. The device of claim 10 wherein the optical blocking region comprising an n-type dopant.

15. The device of claim 10 wherein the optical blocking region comprising an n-type dopant having a carrier concentration of about 1E16 cm-3 to 1E19 cm-3 or 1E19 cm-3 to 1E20 cm-3.

16. The device of claim 10 wherein the optical blocking region comprising an n-type dopant, the n-type dopant comprising silicon.

17. The device of claim 10 wherein the optical blocking region has a thickness of about 30 to 2000 nm.

18. The device of claim 10 wherein the optical blocking region is configured about 10 to 500 nm below the active region.

19. The device of claim 10 wherein the optical blocking region is configured about 500 to 2000 nm below the active region.

20. The device of claim 10 wherein the optical blocking region is separated from the active region by at least n-type GaN.

21. The device of claim 10 wherein the active region is comprised of 3 to 7 quantum wells, each of the quantum wells comprising substantially InGaN; wherein the plurality of quantum well regions range in thickness from 2 nm to 8 nm; and further comprising at least one barrier region sandwiched between a pair of quantum well regions in the active region; wherein each of the barrier regions is comprised of one of GaN, InGaN, AlGaN, and AlInGaN, and wherein each of the barrier regions has a thickness between 1.5 nm and 12 nm.

22. The device of claim 10 wherein the surface region is configured in a semi-polar orientation, the semi-polar orientation being one of {20-21}, {30-3-1} and {30-31} orientation.

23. An optical device comprising:
    a gallium and nitrogen containing substrate comprising a surface region, the surface region being configured in a non-polar or semi-polar orientation;
    an optical blocking region comprising low Ga content InAlGaN overlying the surface region where $In_yAl_{1-x-y}Ga_xN$ and x is less than about 30%;
    an n-type cladding region overlying the optical blocking region;
    an InGaN region overlying the n-type cladding region, the optical blocking region having a lower refractive index than the n-type cladding region, and the InGaN region having a higher refractive index than the n-type cladding region;

a plurality of quantum well regions overlying the InGaN region; and whereupon the optical device is free from AlGaN or InAlGaN cladding regions.

24. The device of claim 23 wherein the optical blocking region is strained.

* * * * *